United States Patent [19]
Odake et al.

[11] Patent Number: 6,030,869
[45] Date of Patent: Feb. 29, 2000

[54] METHOD FOR FABRICATING NONVOLATILE SEMICONDUCTOR MEMORY DEVICE

[75] Inventors: Yoshinori Odake; Takashi Maejima, both of Osaka; Hidenori Tanaka, Nara; Mitsuyoshi Andou; Toshimoto Kubota, both of Kyoto, all of Japan

[73] Assignee: Matsushita Electronics Corporation, Osaka, Japan

[21] Appl. No.: 09/158,985

[22] Filed: Sep. 23, 1998

[30] Foreign Application Priority Data

Sep. 26, 1997 [JP] Japan ................................ 9-261570

[51] Int. Cl.⁷ .................................................. H01L 21/336
[52] U.S. Cl. ........................... 438/266; 438/286; 438/305
[58] Field of Search .................................... 438/257, 262, 438/263, 264, 265, 266, 301, 302, 303, 305, 306, 307, 525, 529, 595, 286

[56] References Cited

U.S. PATENT DOCUMENTS

| 5,712,814 | 1/1998 | Fratin et al. | 257/194 |
| 5,780,893 | 7/1998 | Sugaya | 257/318 |
| 5,780,902 | 7/1998 | Komuro | 257/344 |

FOREIGN PATENT DOCUMENTS 60-134477  7/1985  Japan .

OTHER PUBLICATIONS

Y. Ohshima et al., "Process and Device Technologies for 16Mbit EPROMs with Large–Tilt–Angle Implanted P–Pocket Cell", 1990 IEEE IEDM, pp. 95–98, 1990.

H. Kume et al., "A Flash–Erase EEPROM Cell with an Asymmetric Source and Drain Structure", 1987 IEEE IEDM, pp. 560–563, 1987.

*Primary Examiner*—Charles Bowers
*Assistant Examiner*—Jack Chen
*Attorney, Agent, or Firm*—Eric J. Robinson; Sixbey, Friedman, Leedom & Ferguson, PC

[57] ABSTRACT

A method for fabricating a nonvolatile semiconductor memory device having a stacked gate portion, including a tunnel insulating film, a floating gate electrode, a capacitive insulating film and a control gate electrode, formed over a p-type Si substrate. In the p-type Si substrate, $n^{++}$ source/drain layers and $n^{+}$ source/drain layers, each layer containing arsenic, are formed. In the drain region, an $n^{-}$ drain layer, containing phosphorus and overlapping with an entire edge of the stacked gate portion in the gate width direction, and a p layer surrounding the bottoms of the $n^{+}$ and the $n^{-}$ drain layers are provided. In such a structure, an electric field applied between the floating gate electrode and the drain is weakened and the drain-disturb characteristics are improved during writing.

7 Claims, 18 Drawing Sheets

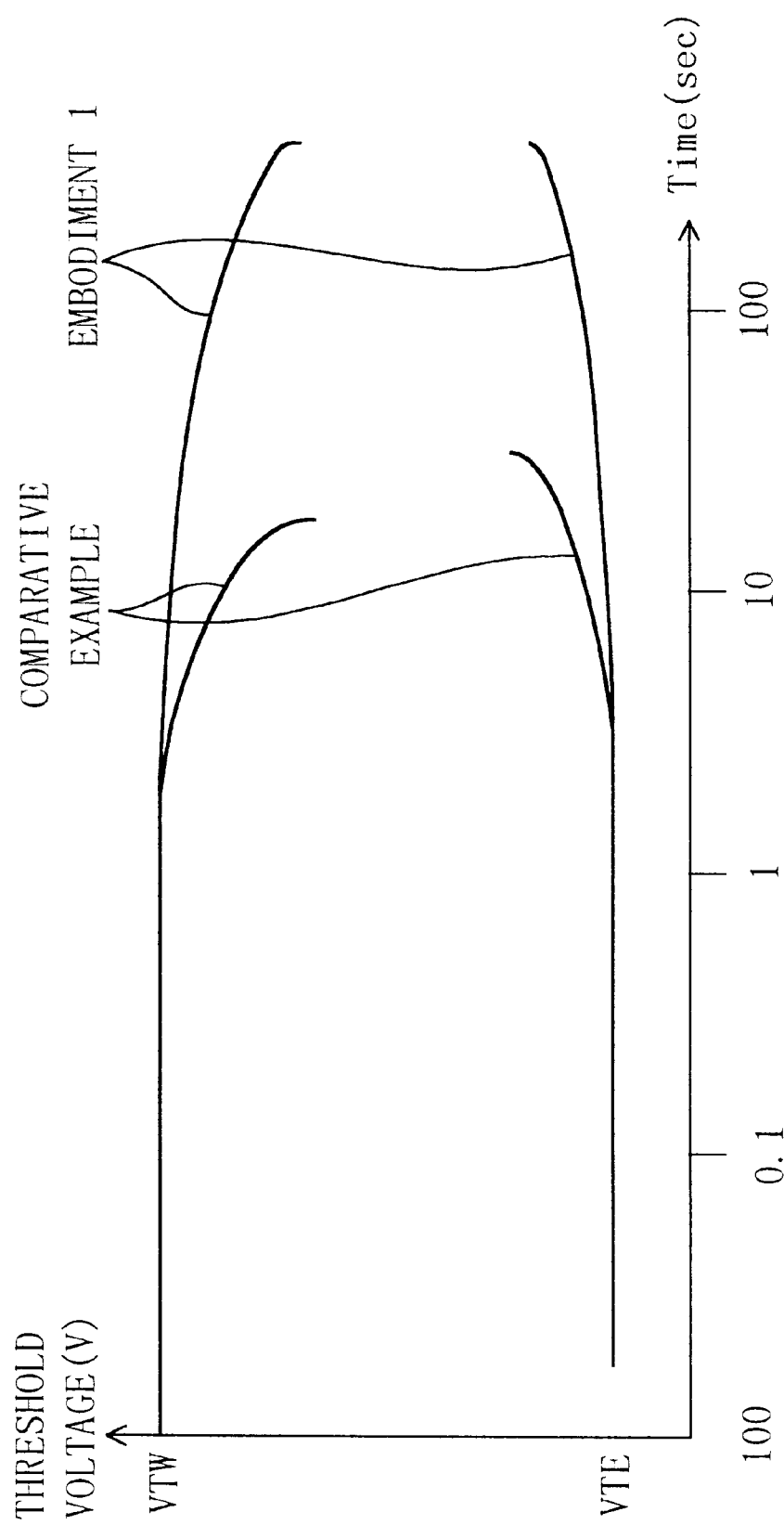

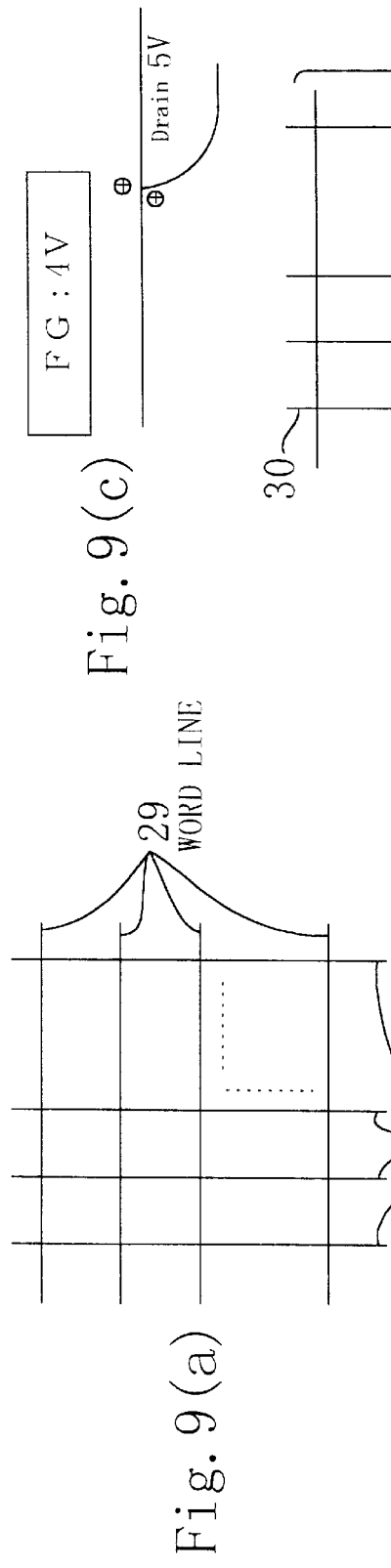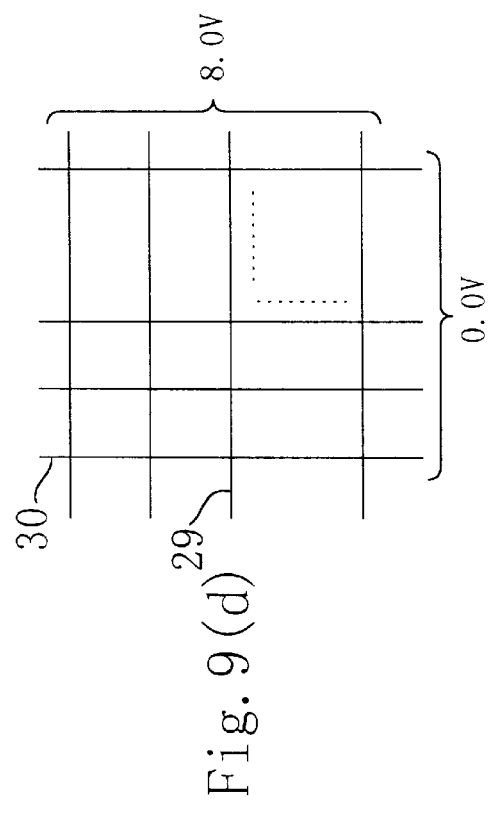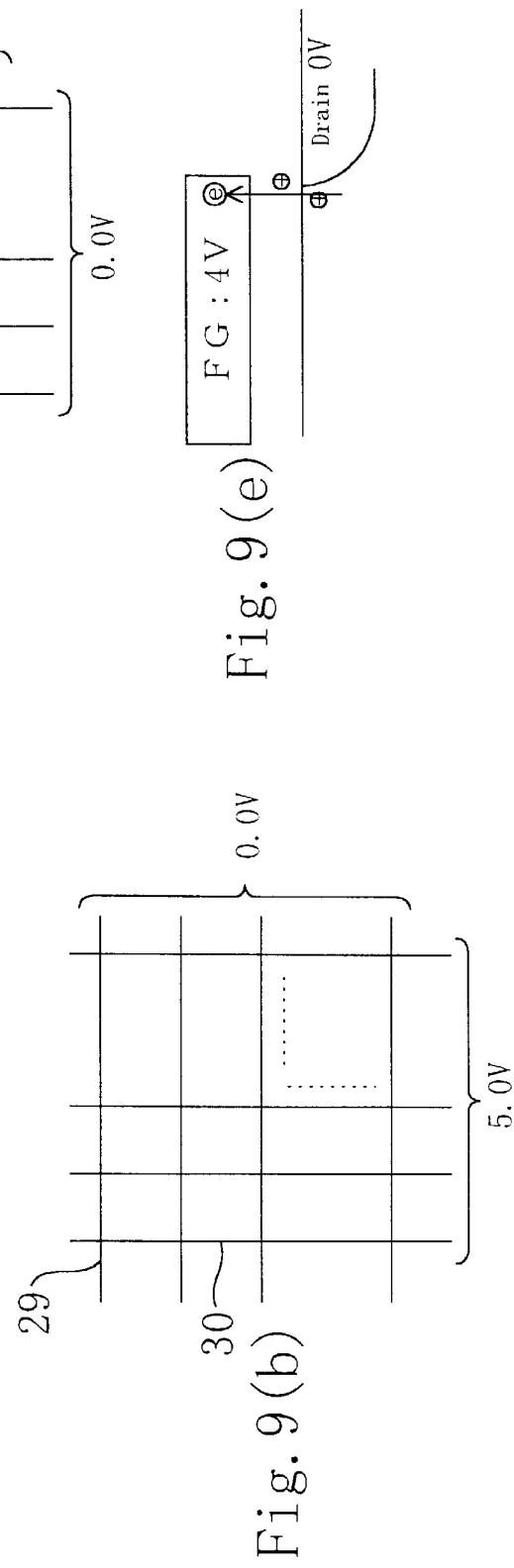
Fig. 9(a) Fig. 9(b) Fig. 9(c) Fig. 9(d) Fig. 9(e)

- cell stacked gate definition
- N⁺ shallow drain
  ion-implant As $x_1 = 0.15 \mu m$
- Large-Tilt-Angle
  p-pocket ion-implant B
- peripheral transister
  definition
- N⁻ deep drain
  ion-Implant As $x_1 = 0.2 \mu m$
- activation
- N⁻ ion-implant
  peripheral LDD

METHOD FOR FABRICATING NONVOLATILE SEMICONDUCTOR MEMORY DEVICE

BACKGROUND OF THE INVENTION

The present invention relates to a nonvolatile semiconductor memory device including a floating gate electrode and a method for fabricating the same, and more particularly relates to measures taken for improving drain-disturb characteristics.

Conventionally, a nonvolatile semiconductor memory device having a memory cell structure, in which a memory cell transistor including a floating gate electrode is formed, has been known as a means for realizing even higher degree of integration. Such nonvolatile semiconductor memory devices are disclosed, for example, in Japanese Laid-Open Publication No. 60-134477 and an article entitled "Process and Device Technologies for 16 Mbit EPROMs with Large-Tilt-Angle Implanted P-Pocket Cell", IEDEM 90, pp. 95–98.

FIG. 16($a$) is a cross-sectional view illustrating a memory cell structure of the nonvolatile semiconductor memory device described in the above-identified article. As shown in FIG. 16($a$), a stacked gate portion 110 is formed on a p-type Si substrate 101 in each memory cell. The stacked gate portion 110 includes: a gate oxide film 102 functioning as a tunnel insulating film, too; a floating gate electrode 103 made of polysilicon; a capacitive insulating film 104 made of ONO; and a control gate electrode 105 made of polysilicon. A protective insulating film 106 is provided over the stacked gate portion 110. In the p-type Si substrate 101, an $n^{++}$ drain layer 126$a$ ($n^{++}$ deep drain) and an $n^{++}$ source layer 126$b$, each layer containing arsenic (As) at a high concentration; an $n^+$ drain layer 123 (shallow drain) containing arsenic at a low concentration; and a pair of p-pockets 124$a$, 124$b$, containing phosphorus (P) and functioning as punch through stoppers, are formed.

FIG. 16($b$) is a flow chart illustrating the process steps for fabricating this nonvolatile semiconductor memory device. First, after the stacked gate portion 110 has been defined, arsenic ions are implanted to form the shallow drain ($n^+$ drain layer 123). Next, boron (B) ions are implanted in accordance with large-angle-tilt ion implantation technique, thereby forming the p-pockets 124$a$, 124$b$. Then, after peripheral transistors have been formed, arsenic ions are implanted again to form the deep drain ($n^{++}$ drain layer 126$a$) and a heat treatment is conducted, thereby activating the impurities implanted into the respective regions. Thereafter, n-type impurity ions are implanted at a low concentration to form LDD regions for the peripheral transistors. Though not illustrated in FIG. 1 of that article, insulator sidewalls seem to be formed on the side surfaces of the stacked gate portion 110 as indicated by the broken lines in FIG. 16($a$). And the ion implantation for forming the deep drain seems to be performed using the stacked gate portion 110 and the insulator sidewalls as a mask.

Next, the operation of the conventional nonvolatile semiconductor memory device will be described.

A write operation is performed by applying a voltage of about 10 V to the control gate electrode 105 and a voltage of about 5 V to the $n^{++}$ drain layer 126$a$, generating channel hot electrons in the vicinity of the junction between the p-pocket 124$a$ and the $n^+$ layer 123 and injecting and accumulating the channel hot electrons in the floating gate electrode 103. An erasure operation is performed by applying a voltage of about 12 V to the $n^{++}$ source layer 126$b$ and making FN (Fowler-Nordheim) tunneling current take out the electrons accumulated in the floating gate electrode 103. And a read operation is performed by applying a voltage of about 5 V to the control gate electrode 105 and a voltage of about 1 V to the $n^{++}$ drain layer 126$a$ and sensing the amount of electrons accumulated in the floating gate electrode 103 based on the level of drain current. If a sufficiently large number of electrons are accumulated in the floating gate electrode 103, then drain current hardly flows. On the other hand, if substantially no electrons are accumulated in the floating gate electrode 103, then drain current flows abundantly. In accordance with the difference in levels of the drain current, the stored information can be read out.

It is known that in such a nonvolatile semiconductor memory device, the more abrupt the p-n junction between the p-pocket 124$a$ and the $n^+$ drain layer 123 is, the larger number of hot electrons are generated during writing. Since the p-pockets 124$a$, 124$b$ ensure the prevention of punch-through phenomenon, a very fine-line memory cell structure with a gate length as small as about 0.4 $\mu$m is allegedly realized.

However, the nonvolatile semiconductor memory device having a memory cell structure including a shallow drain as disclosed in the above-identified article has the following problems.

In performing a write operation on a memory cell, voltages of about 5 V and about 0 V are respectively applied to the drain and the control gate electrode of a non-selected memory cell connected to a selected bit line, to which a selected memory cell is connected in common. In this case, if electrons have been injected into a floating gate electrode, the potential in the floating gate electrode is about -2 V. As a result, a considerably high electric field is generated between the floating gate electrode and the drain. And in the vicinity of the drain, so-called "gate induced drain leakage current (GIDL)", or a large number of electron-hole pairs, is generated. Then, the holes are attracted to the electric field to enter the gate oxide film (i.e., hot hole traps are generated) or reach the vicinity of the floating gate electrode. The accumulation of holes in the gate oxide film causes the following two disadvantages.

Firstly, since the number of electrons accumulated in the floating gate electrode decreases, the threshold voltage of a non-selected memory cell transistor adversely varies during writing (drain-disturb phenomenon). As a result, erroneous writing possibly happens.

Such variation in threshold voltages is more likely to occur if a high voltage has been continuously applied between the floating gate electrode and the drain of the memory cell for a long time. In this case, as the degree of integration of a nonvolatile semiconductor memory device is higher, the number of memory cells connected to a single bit line increases correspondingly. For example, in an array of 1-Mbit memory cells, 1,024 memory cells are connected to a common bit line. Thus, in performing a write operation on such a memory, a high voltage is continuously applied between the floating gate electrode and the drain of a single memory cell for as long as 1 second or more. This time interval will tend to get longer as an even higher degree of integration is realized for a nonvolatile semiconductor memory device. In other words, in order to further increase the degree of integration for a nonvolatile semiconductor memory device, it is indispensable to improve the drain-disturb characteristics.

Secondly, since the accumulation of holes deteriorates the quality of a gate oxide film, the reliability is adversely deteriorated.

SUMMARY OF THE INVENTION

The object of the present invention is realizing an even higher degree of integration for and improving the reliability of a nonvolatile semiconductor memory device of the type including a floating gate electrode for a memory cell by improving the drain-disturb characteristics thereof so as to prevent holes from entering and being accumulated in a gate oxide film.

The nonvolatile semiconductor memory device of the present invention includes: a semiconductor substrate of a first conductivity type; a stacked gate portion formed by stacking a tunnel insulating film, a floating gate, a capacitive insulating film and a control gate in this order over the semiconductor substrate; source/drain regions of a second conductivity type, which are formed in an active region under the surface of the semiconductor substrate so as to sandwich the stacked gate portion therebetween; and a region of the first conductivity type surrounding the bottom of the drain region of the second conductivity type. The device performs a write operation by generating hot carriers with the application of a voltage between the drain and the source. The drain region at least includes a first diffusion layer containing a first impurity of the second conductivity type, and a second diffusion layer containing a second impurity of the second conductivity type having a larger range than that of the first impurity during ion implantation. At least the second diffusion layer overlaps with an entire edge of the stacked gate portion in a gate width direction in the active region when the second diffusion layer and the stacked gate portion are viewed from above.

In this device, the drain region includes first and second diffusion layers containing at least two types of impurities of the second conductivity type, and at least the second diffusion layer overlaps with an entire edge of the stacked gate portion in a gate width direction in the active region. Thus, though an abrupt p-n junction is still formed between the drain region and the region of the first conductivity type, it is possible to eliminate a part not overlapping with the floating gate from the drain region. Accordingly, the drain-disturb characteristics can be improved and improvement of reliability and an even higher degree of integration are realized without decreasing a write speed or increasing the short channel effect.

In one embodiment of the present invention, the first impurity may be arsenic and the second impurity may be phosphorus. Then, the above-described effects can be attained by utilizing the fact that the range of phosphorus during ion implantation is larger than that of arsenic.

In another embodiment, the source region preferably consists of regions of the second conductivity type.

In still another embodiment, the diffusion coefficient of the second impurity is preferably larger than that of the first impurity during heat treatment for activating the impurities.

A method for fabricating a nonvolatile semiconductor memory device according to the present invention includes the steps of: a) forming a stacked gate portion by stacking a tunnel insulating film, a floating gate, a capacitive insulating film and a control gate in this order over a semiconductor substrate of a first conductivity type; b) forming source/drain regions of a second conductivity type in an active region under the surface of the semiconductor substrate so as to sandwich the stacked gate portion therebetween; and c) forming a region of the first conductivity type surrounding the bottom of the drain region of the second conductivity type. In the step b), at least two types of impurity ions of the second conductivity type having respectively different ranges are implanted and a heat treatment is conducted, thereby forming the drain region so as to include at least two types of diffusion layers of the second conductivity type, one of the two types of diffusion layers containing the impurity ions having the larger range overlapping with an entire edge of the stacked gate portion in a gate width direction in the active region when the diffusion layer and the stacked gate portion are viewed from above.

In accordance with this method, a nonvolatile semiconductor memory device attaining the above-described effects can be formed easily.

In one embodiment of the present invention, in the step b), a dose of the impurity ions having the larger range is preferably set smaller than a dose of the impurity ions having the smaller range.

In another embodiment, in the step b), at least one out of the at least two types of impurity ions of the second conductivity type may be implanted immediately after the stacked gate portion has been formed. Then, the second diffusion layer of the drain region can be formed to reach a point inside the stacked gate portion.

In still another embodiment, in the step c), the region of the first conductivity type is preferably formed by implanting impurity ions of the first conductivity type at a tilt angle of 20 degrees or more with respect to the normal of the semiconductor substrate in accordance with large-angle-tilt ion implantation technique such that the impurity ions are also implanted into a region under the stacked gate portion. In such an embodiment, the region of the first conductivity type can be easily formed to surround the bottom of the drain region of the second conductivity type below the stacked gate portion.

In still another embodiment, the impurity ions having the larger range preferably have a larger diffusion coefficient than that of the impurity ions having the smaller range during heat treatment for activating the impurities.

BRIEF DESCRIPTION OF THE DRAWINGS

FIG. 7 is a graph illustrating the drain-disturb characteristics of the nonvolatile semiconductor memory device of the first embodiment and a nonvolatile semiconductor memory device of a comparative example.

FIGS. 9(a) through 9(e) are circuit block diagrams and schematic cross-sectional views illustrating a method for inspecting an array of memory cells of a nonvolatile semiconductor memory device in the second embodiment.

DESCRIPTION OF THE PREFERRED EMBODIMENTS

Embodiment 1

Figure 1:
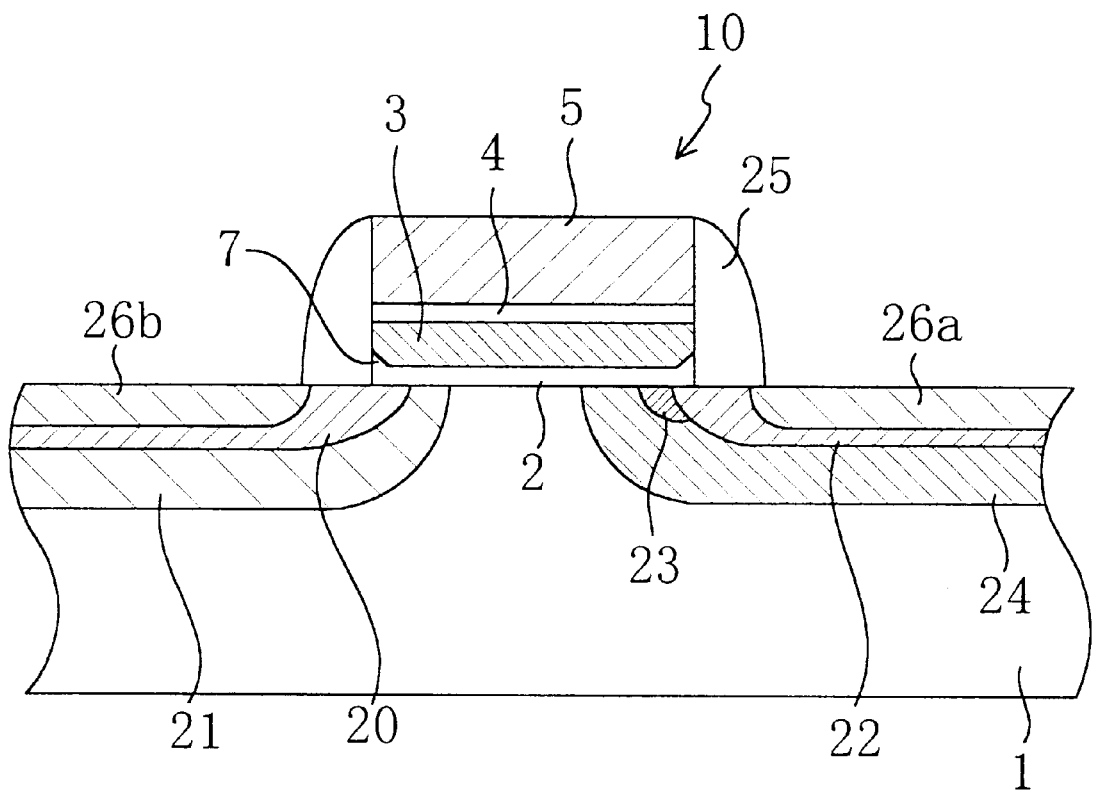
FIG. 1 is a cross-sectional view illustrating a memory cell structure of a nonvolatile semiconductor memory device in the first embodiment.

Hereinafter, the first embodiment of the present invention will be described with reference to the drawings. FIG. 1 is a cross-sectional view illustrating a structure for a nonvolatile semiconductor memory device of this embodiment.

FIGS. 2(a) through 2(c) and FIGS. 3(a) through 3(c) are cross-sectional views illustrating the process steps for fabricating the nonvolatile semiconductor memory device of this embodiment.

As shown in FIG. 1, the nonvolatile semiconductor memory device of this embodiment includes a stacked gate portion on a p-type Si substrate 1 containing B (boron) ions of the first conductivity type. The stacked gate portion 10 is formed by stacking: a tunnel insulating film 2 made of silicon dioxide; a floating gate electrode 3 made of polysilicon; a capacitive insulating film 4 made of ONO; and a control gate electrode 5 made of polysilicon and functioning as a word line in this order over the substrate 1. Insulator sidewalls 25, made of silicon dioxide, are provided on the side surfaces of the entire stacked gate portion 10. In respective regions of the p-type Si substrate 1, $n^{++}$ drain/source layers 26a, 26b containing arsenic (As) at a high concentration, and $n^+$ drain/source layers 22, 20, which contain arsenic at a relatively high concentration and are formed so as to surround the bottoms of the $n^{++}$ drain/source layers 26a, 26b, respectively, are formed in the vicinity of the insulator sidewalls 25. Also, an $n^-$ source layer 21 containing P (phosphorus) is formed so as to surround the bottom of the $n^+$ source layer 20 in the source region of the p-type Si substrate 1. On the other hand, in the drain region of the p-type Si substrate 1, an $n^-$ drain layer 23 containing phosphorus is formed inside the $n^+$ drain layer 22 so as to overlap with the stacked gate portion 10 and a p layer 24 is formed so as to surround the bottoms of the $n^+$ and $n^-$ drain layers 22 and 23.

That is to say, the nonvolatile semiconductor memory device of this embodiment is primarily characterized by the drain region including: the $n^{++}$ drain layer 26a containing arsenic as an impurity of the second conductivity type; the $n^+$ drain layer 22 also containing arsenic; and the $n^-$ drain layer 23 containing, as an impurity of the second conductivity type, phosphorus having a broader range during ion implantation and a larger diffusion coefficient during heat treatment than those of arsenic. In other words, the memory cell structure of this embodiment is greatly different from that of the nonvolatile semiconductor memory device described in the above-identified article in that the device of this embodiment includes the $n^-$ drain layer 23. And the $n^-$ drain layer 23 overlaps with an entire edge of the stacked gate portion 10 in the width direction (i.e., the direction orthogonal to the cross section shown in FIG. 1) in an active region isolated by a LOCOS isolating film 27 (see FIG. 4). The secondary feature of the nonvolatile semiconductor memory device of this embodiment lies in that the p layer 24 is formed only in the drain 25 region and a p-type diffusion layer, corresponding to the p-pocket 124b described in the above-identified article, is not formed in the source region.

So-called "gate bird's beaks" 7 are formed in ridge portions of the floating gate electrode 3 in the vicinity of the source/drain regions as a result of the oxidation of the polysilicon film as if the ridge portions of the floating gate electrode 3 were chamfered.

Hereinafter, a method for fabricating the nonvolatile semiconductor memory device shown in FIG. 1 will be described with reference to FIG. 2(a) through FIG. 3(c).

Figure 2A:
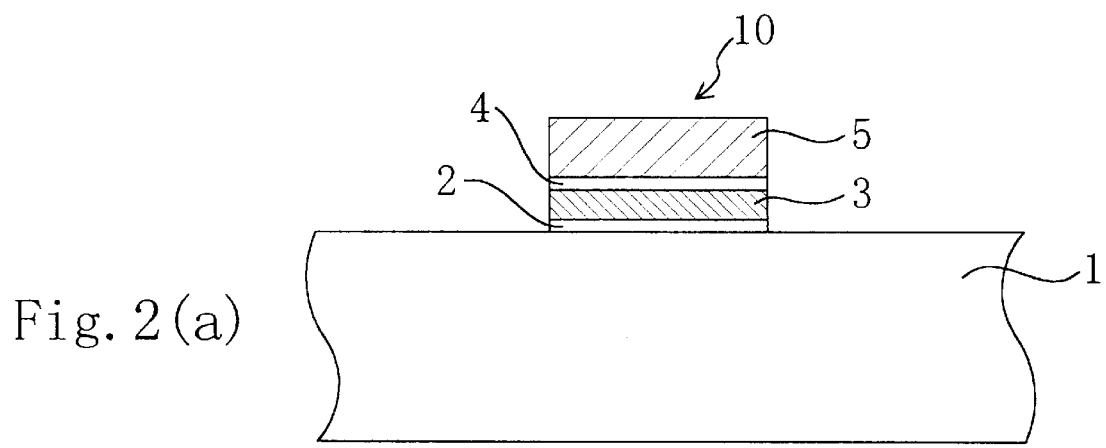
FIGS. 2(a) through 2(c) are cross-sectional views illustrating the first half of the process steps for fabricating the nonvolatile semiconductor memory device in the first embodiment.

First, in the process step shown in FIG. 2(a), a p well and a LOCOS isolating film (neither is shown) are formed in the p-type Si substrate 1. Next, a silicon dioxide film having a thickness of about 10 nm, a first polysilicon film, an ONO film having a thickness of about 18 nm, and a second polysilicon film are sequentially deposited over the p-type Si substrate 1. And the second polysilicon film, the ONO film, the first polysilicon film and the silicon dioxide film are sequentially patterned, thereby forming the stacked gate portion 10 including the control gate electrode 5, the capacitive insulating film 4, the floating gate electrode 3 and the tunnel insulating film 2.

Figure 2B:

Then, in the process step shown in FIG. 2(b), a thermal oxidation process is conducted, thereby forming a protective oxide film 6 over the entire surface of the substrate. During this oxidation process, the ridge portions at the lower ends of the floating gate electrode 3 are oxidized to form the gate bird's beaks 7. The protective oxide film 6 is formed to prevent unnecessary contamination during the implantation of various types of ions. Also, since the gate bird's beaks 7 are simultaneously formed, the ridge portions of the floating gate electrode 3 are as it were chamfered, thereby reducing the concentration of a high electric field at the ends of the floating gate electrode 3.

Figure 2C:
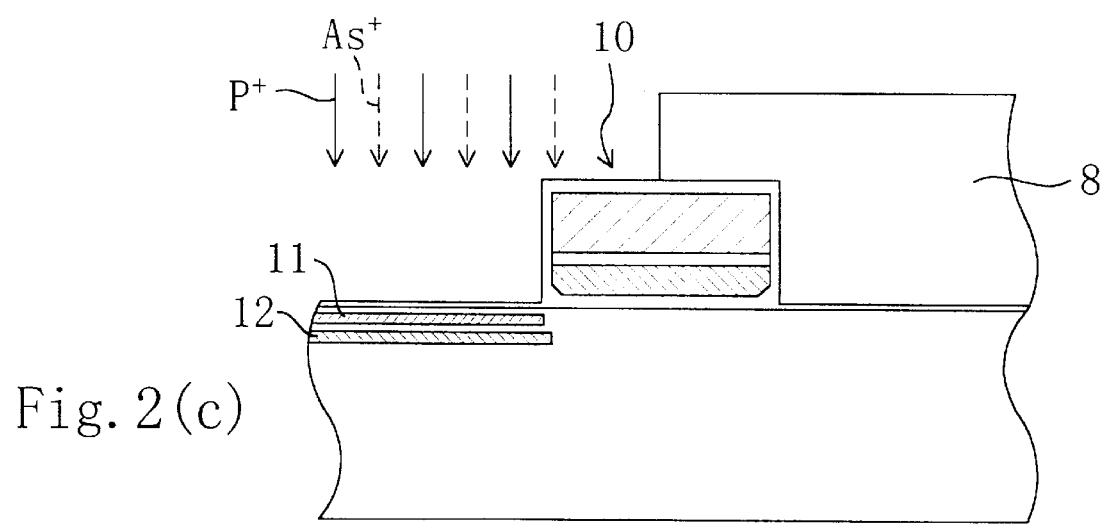

Next, in the process step shown in FIG. 2(c), a resist film 8 is formed to cover approximately half of the stacked gate portion 10 and the entire drain region of the p-type Si substrate 1 and have an opening over the source region of the p-type Si substrate 1. And by using this resist film 8 as a mask, impurity ions are implanted into the source region of the p-type Si substrate 1. First, arsenic ($As^+$) ions are implanted on the conditions that the acceleration voltage is set in the range from 30 keV to 80 keV (preferably from 35 keV to 60 keV) and the dose is set at about $6\times10^{15}$ $cm^{-2}$, thereby forming an arsenic ion implanted layer 11. Then, phosphorus ($P^+$) ions are implanted on the conditions that the acceleration voltage is set in the range from 30 keV to 80 kev (preferably from 35 keV to 60 keV) and the dose is set at about $1.5\times10^{15}$ $cm^{-2}$, thereby forming a phosphorus ion implanted layer 12. In FIG. 2(c), only the peak portions of the arsenic and phosphorus ion implanted layers 11, 12 are illustrated. However, in actuality, the arsenic and phosphorus ion implanted layers 11, 12 both expand over wide areas in the depth direction.

Figure 3A:
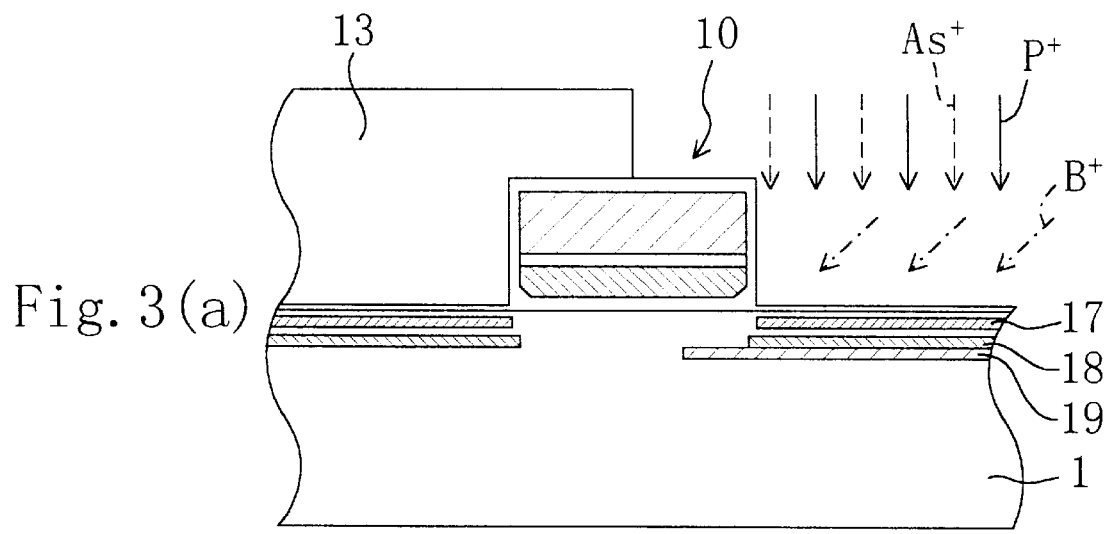
FIGS. 3(a) through 3(c) are cross-sectional views illustrating the second half of the process steps for fabricating the nonvolatile semiconductor memory device in the first embodiment.

Subsequently, in the process step shown in FIG. 3(a), a resist film 13 is formed to cover the other half of the stacked gate portion 10 and the entire source region of the p-type Si substrate 1 and have an opening over the drain region of the p-type Si substrate 1. And by using this resist film 13 as a mask, impurity ions are implanted into the drain 10 region of the p-type Si substrate 1. First, $As^+$ ions are implanted on the conditions that the acceleration voltage is set in the range from 30 keV to 80 keV (preferably from 35 keV to 60 keV) and the dose is set at about $5\times10^{14}$ $cm^{-2}$, thereby forming an arsenic ion implanted layer 17. Thereafter, $P^+$ ions are implanted on the conditions that the acceleration voltage is set in the range from 30 keV to 80 keV (preferably from 35 kev to 60 keV) and the dose is set at about $1\times10^4$ $cm^{-2}$, thereby forming a phosphorus ion implanted layer 18. And then boron ($B^+$) ions are implanted on the conditions that the acceleration voltage is set in the range from 40 keV to 70 keV (preferably from 45 keV to 60 keV) and the dose is set at about $2.5\times10^{13}$ $cm^{-2}$, thereby forming a boron ion implanted layer 19. In FIG. 3(a), only the peak portions of the arsenic, phosphorus and boron ion implanted layers 17, 18, 19 are illustrated. However, in actuality, the arsenic, phosphorus and boron ion implanted layers 17, 18, 19 all expand over wide areas in the depth direction. In this process step, $B^+$ ions are implanted in accordance with large-angle-tilt ion implantation technique in which the implant angle is set to be tilted 45 degrees with respect to the normal of the principal surface of the p-type Si substrate 1. In this manner, the boron ion implanted layer 19 can be formed to reach a region overlapping with the stacked gate portion 10.

Figure 3B:
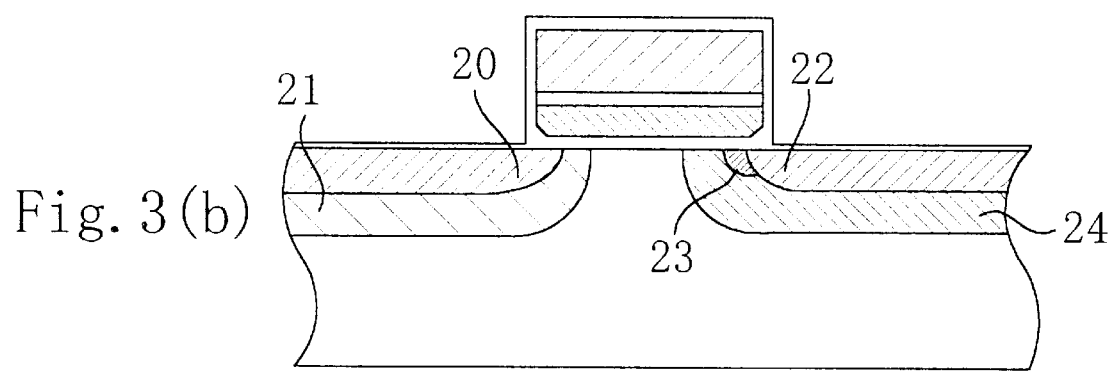

Thereafter, in the process step shown in FIG. 3(b), a heat treatment is conducted at about 900° C., thereby activating and diffusing the impurities in the respective arsenic, phosphorus and boron ion implanted layers 11, 17, 12, 18, 19. In this manner, $n^+$ and $n^-$ source layers 20, 21 are formed in the source region of the p-type Si substrate 1, while $n^+$ and $n^-$ drain layers 22, 23 and a p layer 24 are formed in the drain region thereof. In this process step, as a result of the heat treatment, the $n^-$ source layer 21 containing phosphorus having relatively large range and diffusion coefficient is formed to surround the bottom of the no source layer 20 containing arsenic having smaller range and diffusion coefficient than those of phosphorus in the source region of the p-type Si substrate 1. Also,, in the vicinity of the surface of the p-type Si substrate 1, the $n^-$ source layer 21 is formed over a wide area so as to overlap with the stacked gate portion 10.

In this specification, the "range" means a distance from the surface of a substrate to the center of density distribution of ions implanted into the substrate. Thus, even when two different types of ions are implanted with the same implant energy, the ranges thereof are different from each other depending upon the mass, the atomic radius and the like of the ions. On the other hand, the "diffusion coefficient" is a concept representing how easy particles diffuse. The diffusion coefficient of the same impurity varies depending upon the temperature, the concentration of the impurity and the plane orientation. In this specification, the magnitudes of diffusion coefficients are compared to each other when these parameters are assumed to be equal to each other.

On the other hand, in the drain region of p-type Si substrate 1, the $n^-$ drain layer 23 containing phosphorus having relatively large range and diffusion coefficient is formed in a wider area than that of the $n^+$ drain layer 22 containing arsenic having smaller range and diffusion coefficient than those of phosphorus. Also, in the vicinity of the surface of the p-type Si substrate 1, the $n^-$ drain layer 23 is formed so as to overlap with the stacked gate portion 10. However, since phosphorus contained in the phosphorus ion implanted layer 18 is at a relatively low concentration, phosphorus is neutralized with boron in the boron ion implanted layer 19 in the deeper regions of the p-type Si substrate 1. Thus, the $n^-$ drain layer 23 is formed only in the vicinity of the surface of the p-type Si substrate 1 to overlap with the stacked gate portion 10. The p layer 24 containing boron, which has been implanted with relatively high energy and have a larger diffusion coefficient, is formed to surround the bottoms of the $n^+$ and $n^-$ drain layers 22, 23 and to reach an inner point under the stacked gate portion 10 than the $n^-$ drain layer 23 in the region in the vicinity of the surface of the p-type Si substrate 1.

Figure 3C:
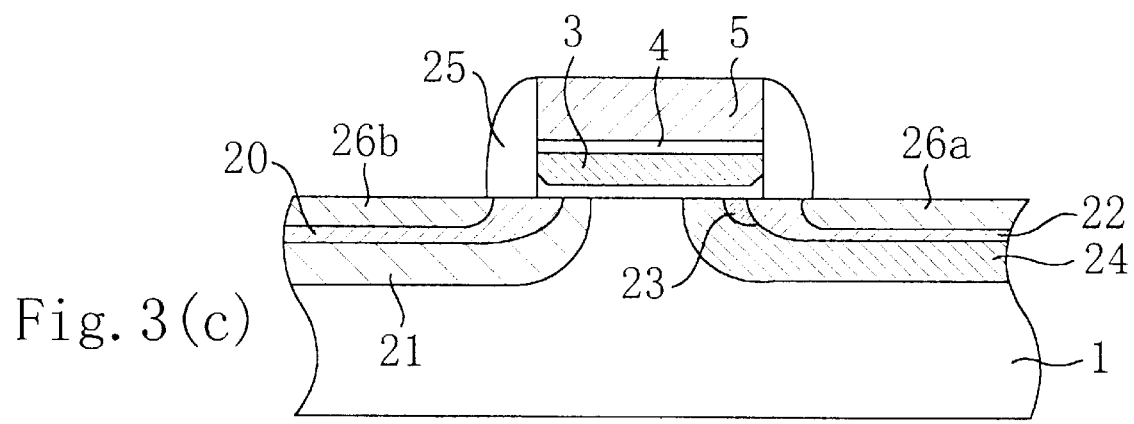

Then, in the process step shown in FIG. 3(c), a silicon dioxide film is deposited over the entire surface of the substrate and then etched back, thereby forming insulator sidewalls 25 on the side surfaces of the stacked gate portion 10. Thereafter, arsenic ions are implanted at a high concentration with the stacked gate portion 10 and the insulator sidewalls 25 used as a mask, thereby forming $n^{++}$ drain/source layers 26a, 26b in the vicinity of the insulator sidewalls 25 in the p-type Si substrate 1.

The method for fabricating a nonvolatile semiconductor memory device in this embodiment is characterized by using two types of ions ($P^+$, $As^+$) having respectively different ranges and diffusion coefficients for forming the respective n layers in the drain region. It is noted that the dose of phosphorus having a higher diffusion coefficient and a broader range is set smaller than the dose of arsenic having a lower diffusion coefficient and a narrower range in order to maintain an abrupt p-n junction between the n-type layers and the p-type layer 24 in the drain region. By employing fabrication process steps such as these, planar and cross-sectional structures to be described below are realized for a memory cell.

COMPARATIVE EXAMPLE TO EMBODIMENT 1

Next, in order to confirm the effects attained by the first embodiment, a comparative example will be described. In the comparative example, a p-type layer, not the pair of p-pockets 124a, 124b in the drain/source regions, is formed as in the first embodiment only in the drain region of the memory cell structure for the nonvolatile semiconductor memory device described in the above-identified article.

FIGS. 12(a) through 12(g) are cross-sectional views illustrating the process steps for fabricating the nonvolatile semiconductor memory device of this comparative example.

Figure 12A:
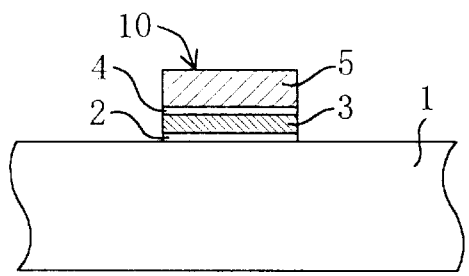
FIGS. 12(a) through 12(g) are cross-sectional views illustrating the process steps for fabricating a nonvolatile semiconductor memory device of a comparative example.
Figure 12E:
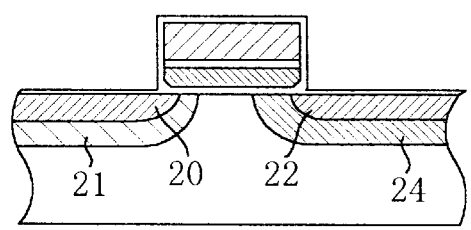
Figure 12B:
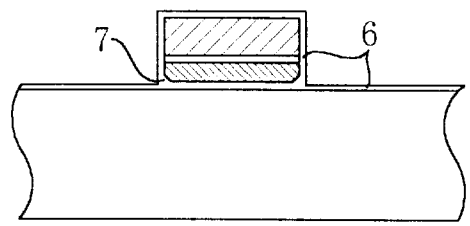
Figure 12F:
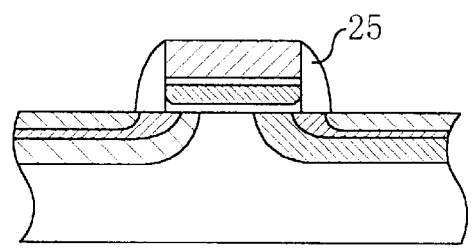
Figure 12C:
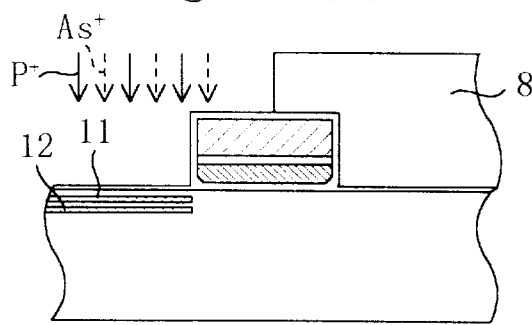

First, in the process steps shown in FIGS. 12(a) through 12(c), the same process steps as those illustrated in FIGS. 2(a) through 2(c) of the first embodiment are performed. Specifically, first, a stacked gate portion 10, including a tunnel insulating film 2, a floating gate electrode 3, a capacitive insulating film 4 and a control gate electrode 5, is formed on a p-type Si substrate 1. Next, a protective oxide film 6 is formed over the entire surface of the substrate. And then arsenic and phosphorus ion implanted layers 11 and 12 are formed in the source region of the p-type Si substrate 1. During these process steps, the same conditions as those of the first embodiment are employed.

Subsequently, in the process step shown in FIG. 12(d), a resist film 13 is formed to cover approximately one half of the stacked gate portion 10 and the source region of the p-type Si substrate 1 and have an opening over the drain region of the p-type Si substrate 1 as in the process step shown in FIG. 3(a) of the first embodiment. And by using this resist film 13 as a mask, impurity ions are implanted into the drain region of the p-type Si substrate 1. In this comparative example, the arsenic and boron ion implanted layers 17, 19 are formed, but the phosphorus ion implanted layer 18 shown in FIG. 3(a) is not formed. The ion implantation conditions for forming the arsenic and boron ion implanted layers 17, 19 are the same as those employed in the first embodiment.

Thereafter, in the process step shown in FIG. 12(e), a heat treatment is conducted at about 900° C., thereby activating and diffusing the impurities in the respective arsenic, phosphorus and boron ion implanted layers 11, 12, 17, 19. In this manner, $n^+$ and $n^-$ source layers 20, 21 are formed in the source region, while an $n^+$ drain layer 22 and a p layer 24 are formed in the drain region. That is to say, this comparative example is different from the first embodiment in that the $n^-$ drain layer dose not exist in the device of this comparative example.

Figure 12G:
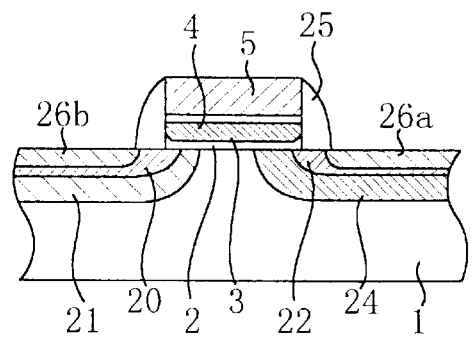
Figure 12D:
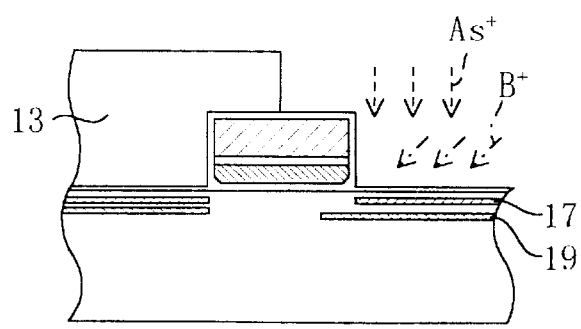

Then, in the process step shown in FIG. 12(f), insulator sidewalls are formed, and arsenic ions are implanted, thereby forming $n^{++}$ drain/source layers 26a, 26b as shown in FIG. 12(g).

COMPARISON BETWEEN COMPARATIVE EXAMPLE AND EMBODIMENT 1

Figure 4:
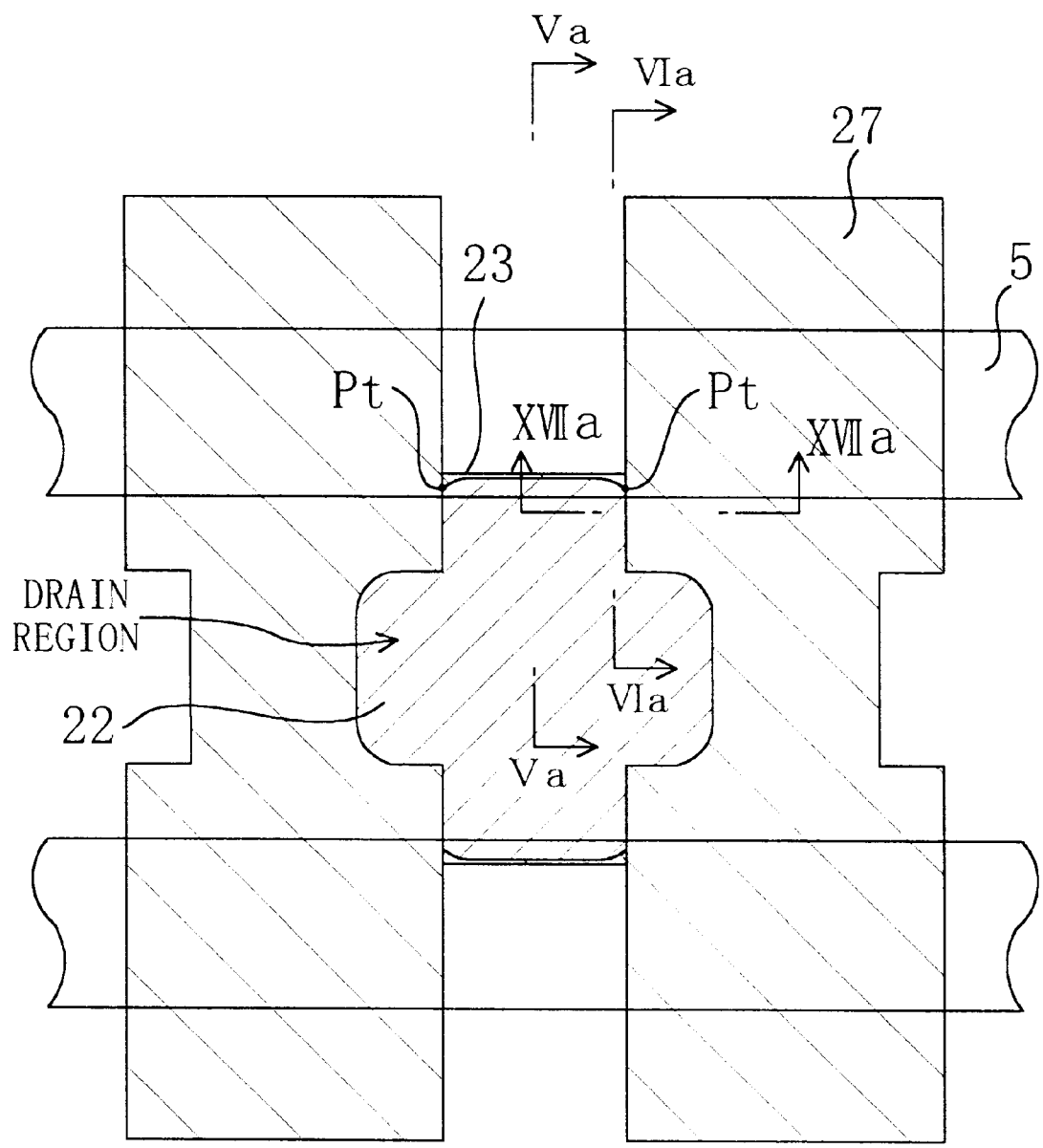
FIG. 4 is a plan view illustrating a part of an array of memory cells for the nonvolatile semiconductor memory device in the first embodiment.
Figure 5A:
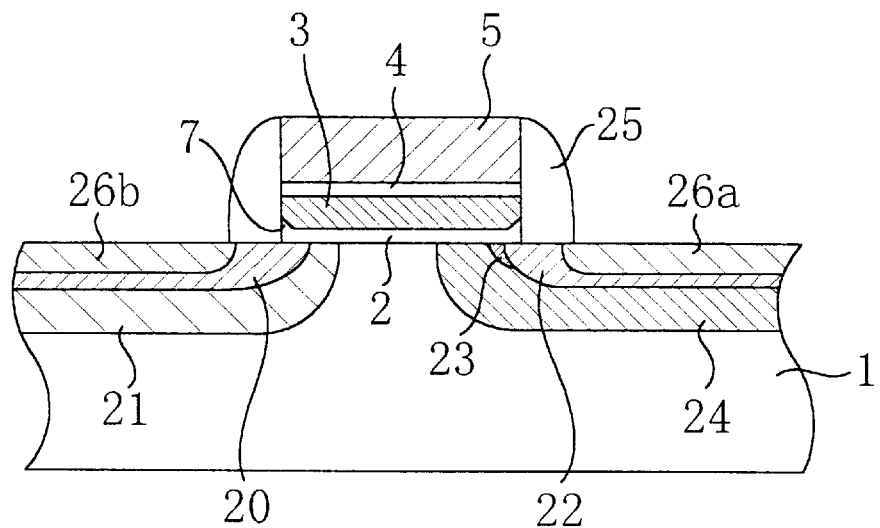
FIG. 5(a) is a cross-sectional view taken along the line Va—Va in FIG. 4.
Figure 5B:
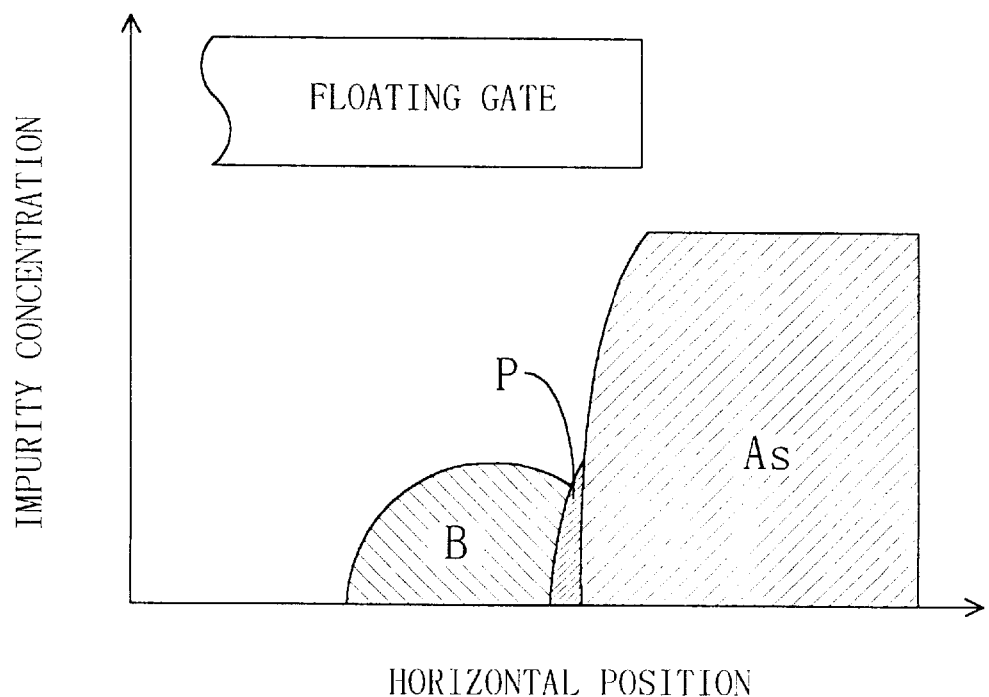
FIG. 5(b) is a diagram showing the variation in concentrations of impurities with respect to horizontal positions along the channel direction.
Figure 6A:
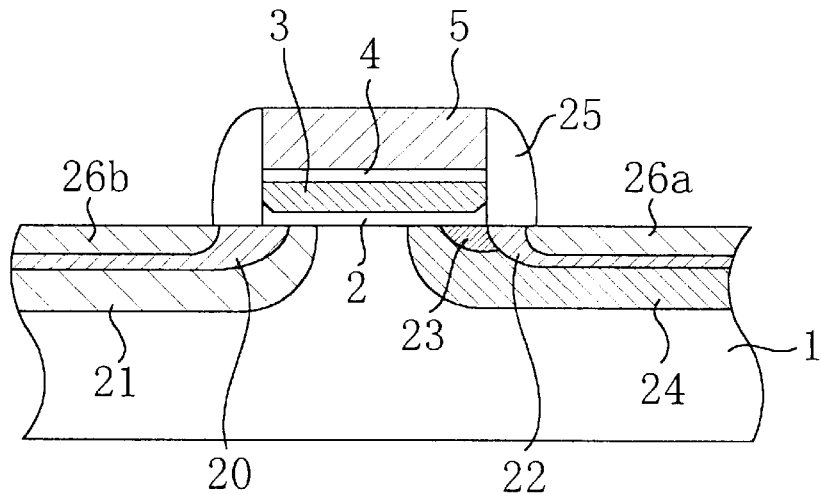
FIG. 6(a) is a cross-sectional view taken along the line VIa—VIa in FIG. 4.
Figure 6B:
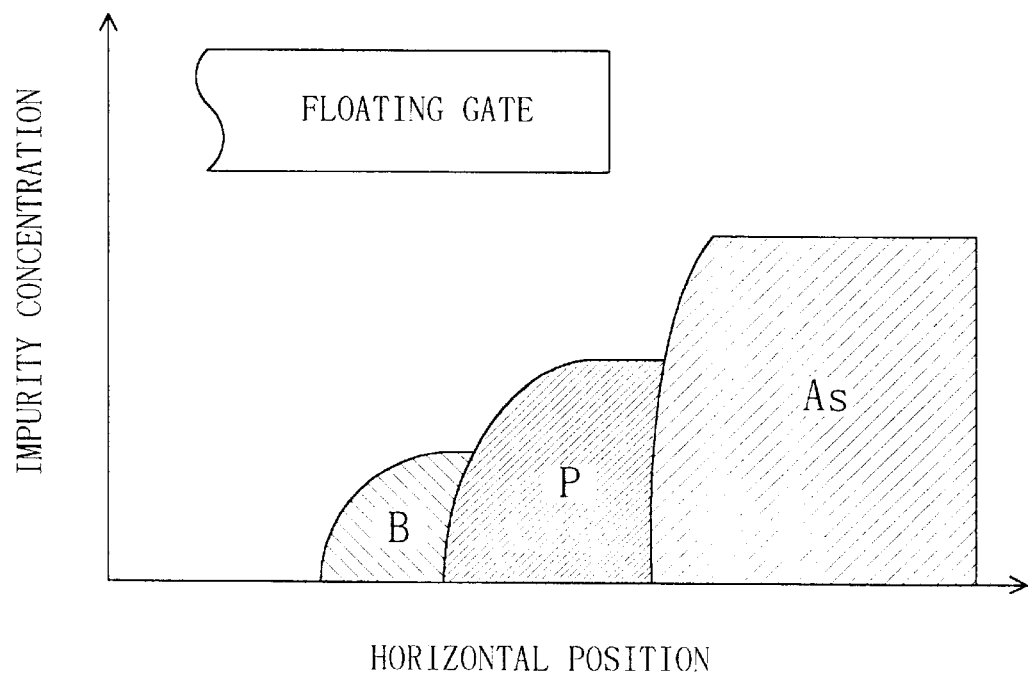
FIG. 6(b) is a diagram showing the variation in concentrations of impurities with respect to horizontal positions along the channel direction.
Figure 6C:
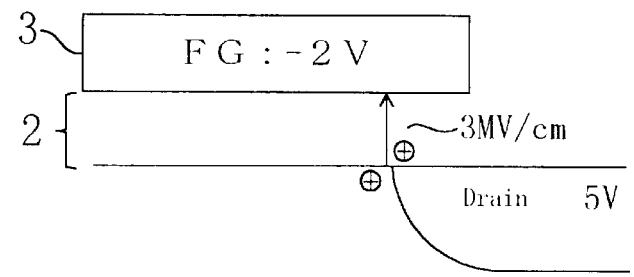
FIG. 6(c) is a schematic cross-sectional view illustrating how the accumulation of hot holes is suppressed at one end of the drain.

FIG. 4 is a plan view illustrating a memory cell for the nonvolatile semiconductor memory device of the first embodiment. FIG. 5(a) is a cross-sectional view taken along the line Va—Va in FIG. 4, and FIG. 5(b) is a diagram showing the variation in concentrations of impurities with respect to horizontal positions along the channel direction. FIG. 6(a) is a cross-sectional view taken along the line VIa—VIa in FIG. 4; FIG. 6(b) is a diagram showing the variation in concentrations of impurities with respect to horizontal positions along the channel direction; and FIG. 6(c) is a view illustrating how the accumulation of hot holes is suppressed at one end of the drain.

Figure 13:
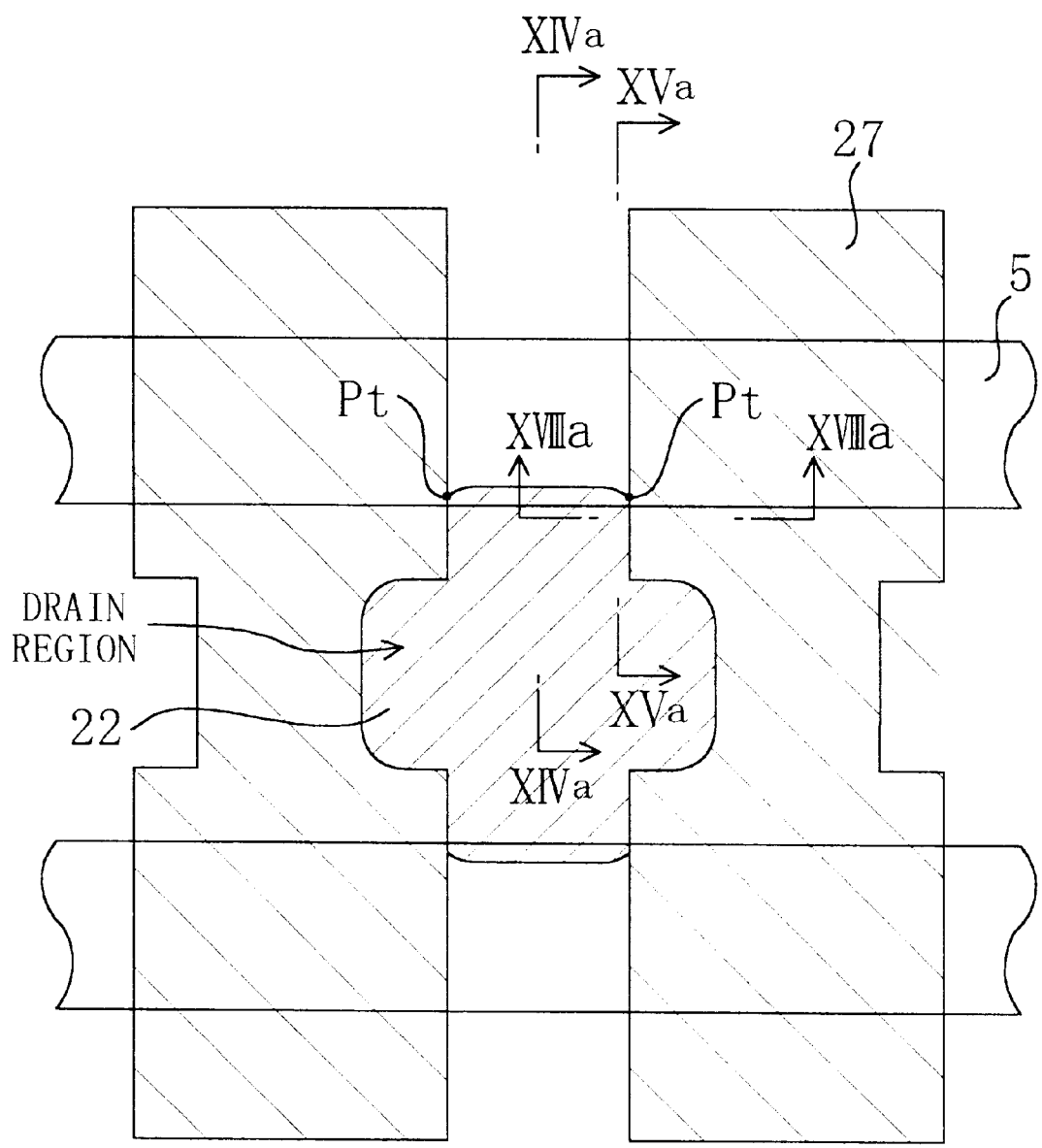
FIG. 13 is a plan view illustrating a part of an array of memory cells for the nonvolatile semiconductor memory device of the comparative example.
Figure 14A:
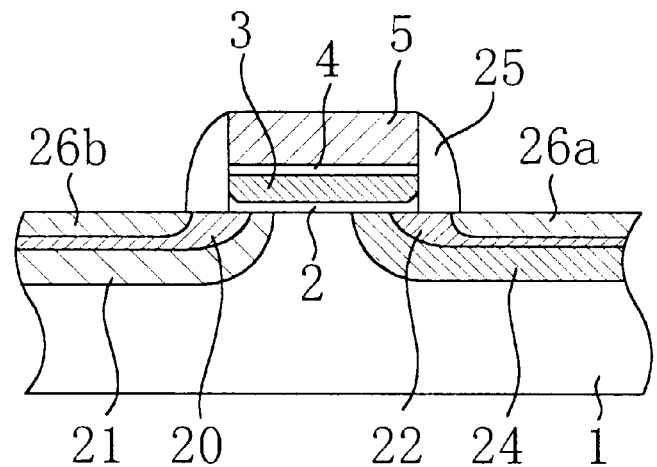
FIG. 14(a), is a cross-sectional view taken along the line XIVa—XIVa in FIG. 13.
Figure 14B:
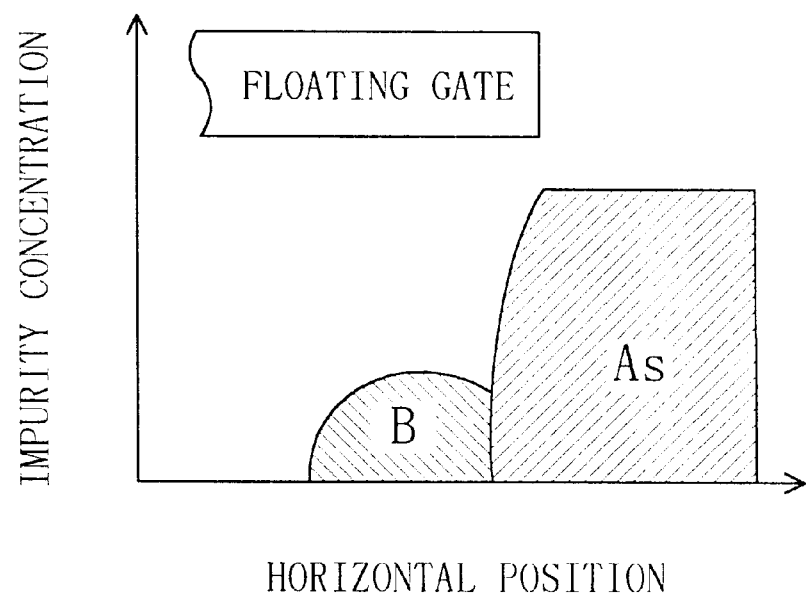
FIG. 14(b) is a diagram showing the variation in concentrations of impurities with respect to horizontal positions along the channel direction.
Figure 15A:
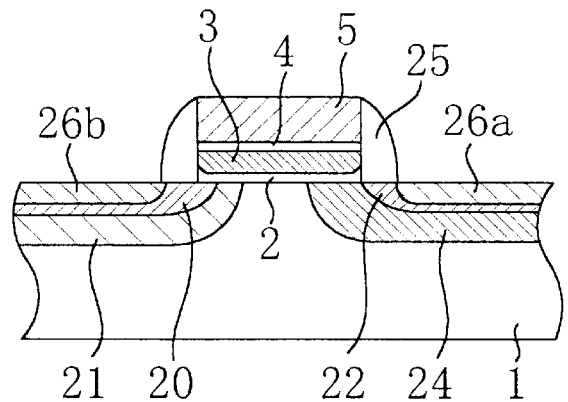
FIG. 15(a) is a cross-sectional view taken along the line XVa—XVa in FIG. 13.
Figure 15B:
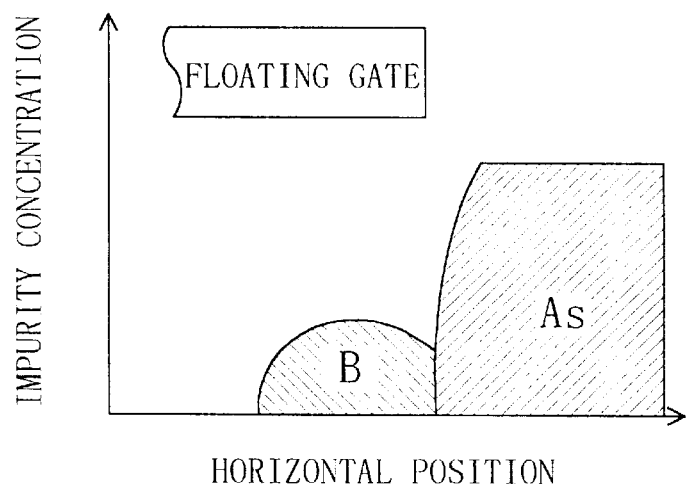
FIG. 15(b) is a diagram showing the variation in concentrations of impurities with respect to horizontal positions along the channel direction.
Figure 15C:
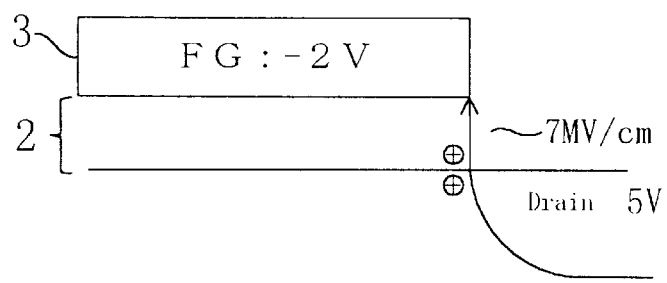
FIG. 15(c) is a schematic cross-sectional view illustrating how hot holes are accumulated at and enter one end of the drain.
Figures 16A, 16B:
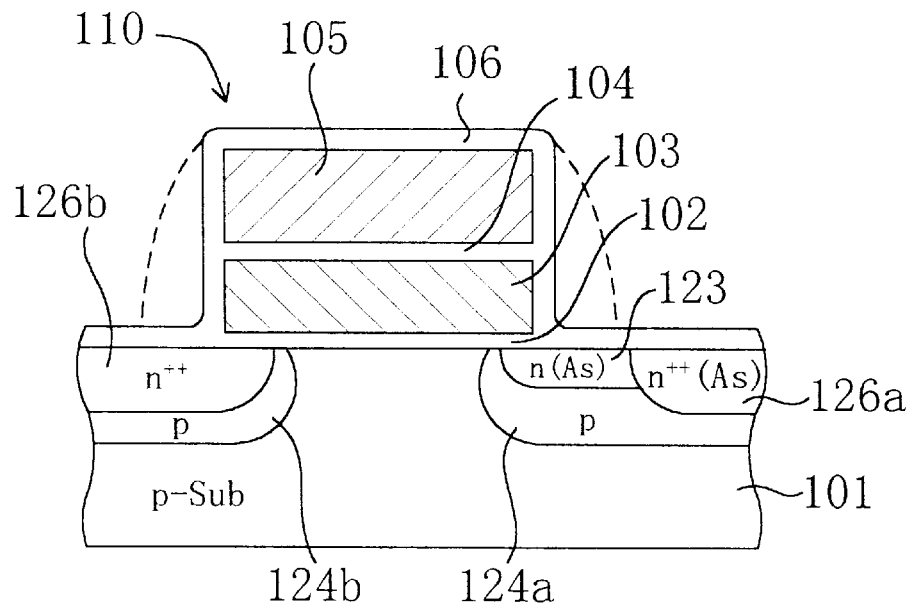
FIG. 16(a) is a cross-sectional view illustrating a memory cell structure of a conventional nonvolatile semiconductor memory device described in the above-identified article of IEDEM 90.
FIG. 16(b) is a flow chart illustrating the process steps for fabricating the conventional nonvolatile semiconductor memory device.
Figure 17A:
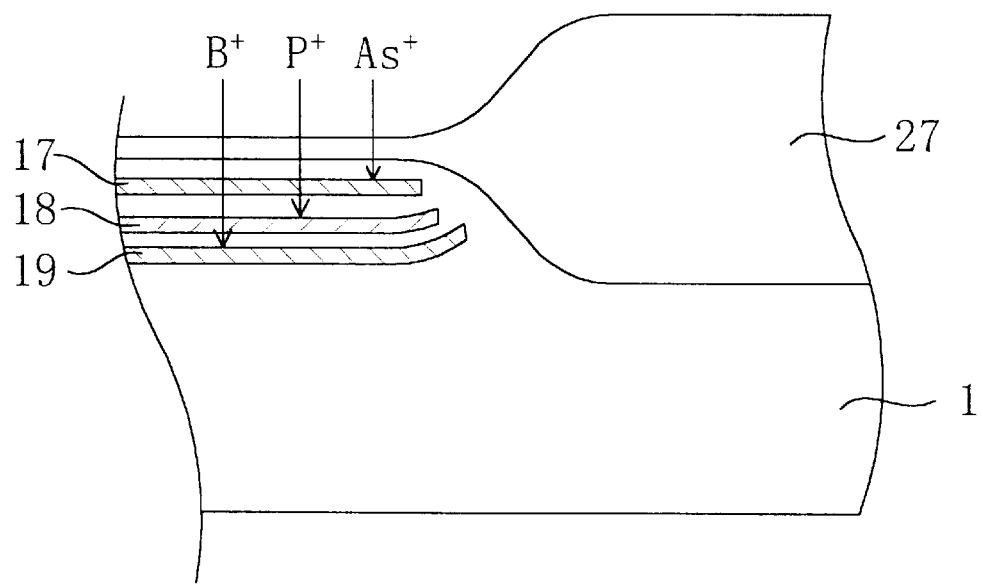
FIGS. 17(a) and 17(b) are cross-sectional views, taken along the line XVIIa—XVIIa in FIG. 4, illustrating how respective ion implanted layers and impurity diffusion regions are formed during implantation of impurity ions.
Figure 17B:
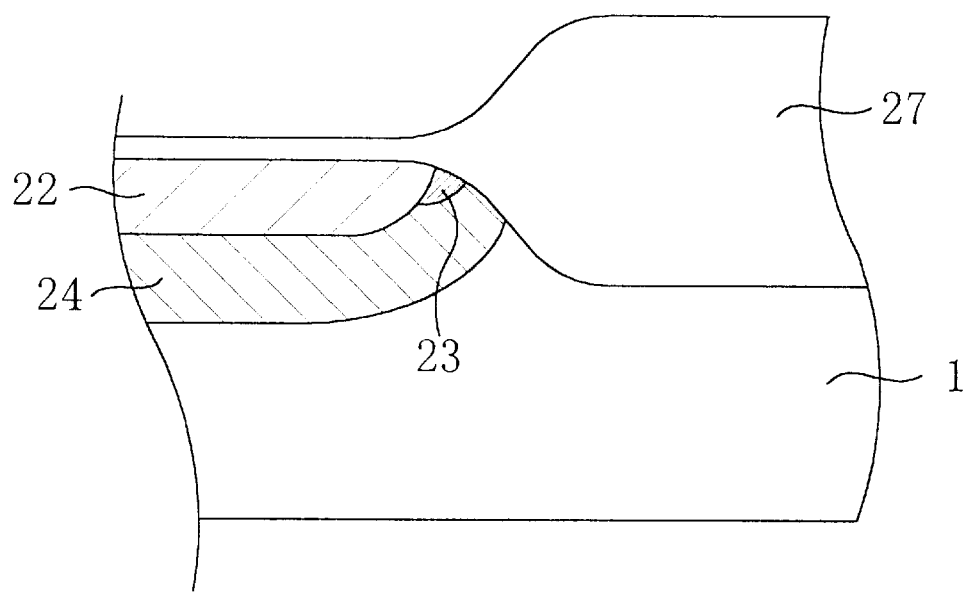
Figure 18A:
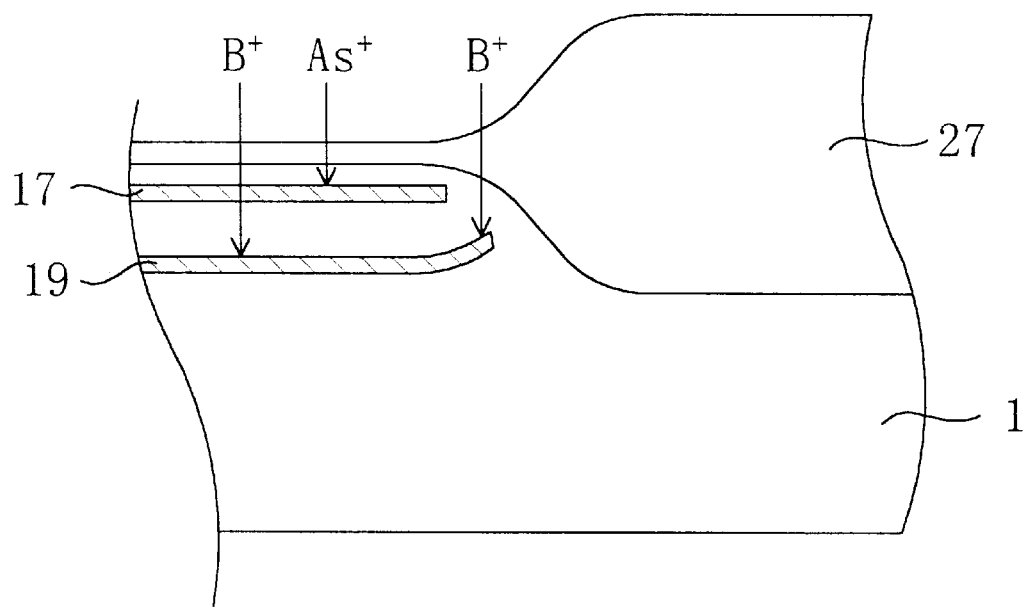
FIGS. 18(a) and 18(b) are cross-sectional views, taken along the line XVIIIa—XVIIIa in FIG. 13, illustrating how respective ion implanted layers and impurity diffusion regions are formed during implantation of impurity ions.
Figure 18B:
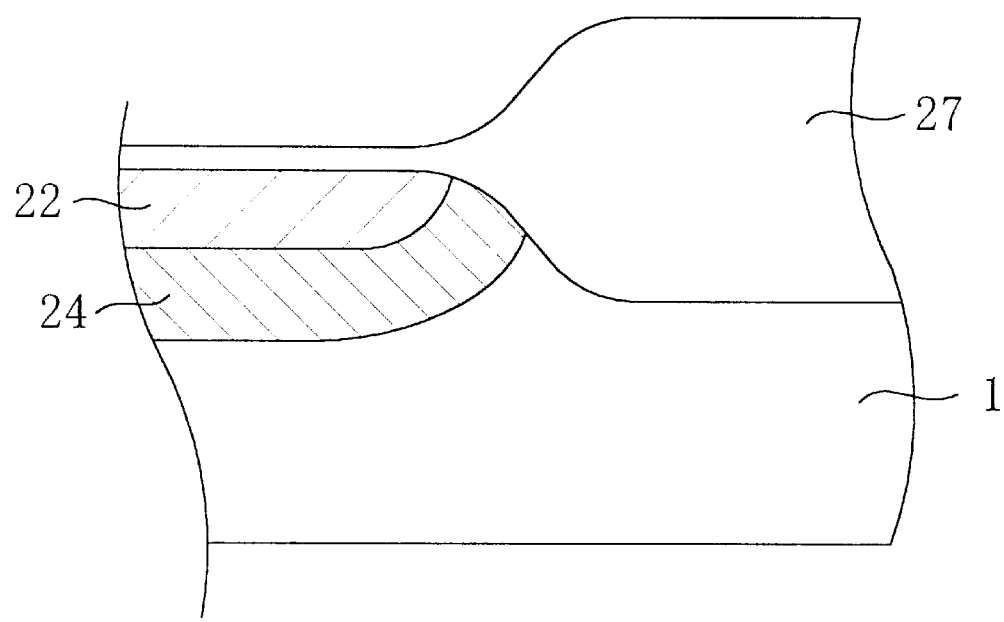

On the other hand, FIG. 13 is a plan view illustrating a memory cell for the nonvolatile semiconductor memory device of the comparative example. FIG. 14(a) is a cross-sectional view taken along the line XIVa—XIVa in FIG. 13, and FIG. 14(b) is a diagram showing the variation in concentrations of impurities with respect to horizontal positions along the channel direction. FIG. 15(a) is a cross-sectional view taken along the line XVa—XVa in FIG. 13; FIG. 15(b) is a diagram showing the variation in concentrations of impurities with respect to horizontal positions along the channel direction; and FIG. 15(c) is a view illustrating how hot holes are accumulated at and enter one end of the drain. FIG. 17(a) is a cross-sectional view, taken along the line XVIIa—XVIIa in FIG. 4, illustrating how respective ion implanted layers are formed during implantation of impurity ions; and FIG. 17(b) is a cross-sectional view, taken along the same line, illustrating how respective impurity diffusion regions are formed after an activation treatment has been performed. FIG. 18(a) is a cross-sectional view, taken along the line XVIIIa—XVIIIa in FIG. 13, illustrating how respective ion implanted layers are formed during implantation of impurity ions; and FIG. 18(b) is a cross-sectional view, taken along the same line, illustrating how respective impurity diffusion regions are formed after an activation treatment has been performed.

As shown in FIG. 13, in the drain region of the memory cell in this comparative example, the $n^+$ drain layer 22, formed by implanting arsenic ions, does not reach the region under the floating gate electrode 3 in the vicinity of a point Pt at which the $n^+$ drain layer 22, a LOCOS isolating film 27 and the control gate electrode 5 as a word line (or the floating gate electrode 3) intersect with each other. This is because of the following reasons.

First, when arsenic ions are implanted, most of the ions are blocked by the bird's beaks of the LOCOS isolating film 27 because the range of arsenic ions is relatively small. On the other hand, boron ions, having a larger range than that of arsenic ions, pass through the bird's beaks of the LOCOS isolating film 27. Thus, as shown in FIG. 18(a), in the cross section orthogonal to the gate length direction of the floating gate electrode 3, the boron ion implanted layer 19 is formed to reach a region immediately under the bird's beaks of the LOCOS isolating film 27, whereas the arsenic ion implanted layer 17 is not formed to reach the region immediately under the bird's beaks of the LOCOS isolating film 27. In addition, during a heat treatment for activating these impurities, arsenic shows a smaller diffusion coefficient than that of boron. As a result, after the heat treatment for activating the impurities has been conducted, the p layer 24 reaches deep into the region under the LOCOS isolating film 27, but the $n^+$ drain layer 22 does not reach the region under the LOCOS isolating film 27, as shown in FIG. 18(b).

By comparison, as shown in FIG. 4, in the drain region of the memory cell in the first embodiment, the $n^+$ drain layer 22, formed by implanting arsenic ions, does not either reach the region under the floating gate electrode 3 in the vicinity of the point Pt at which the LOCOS isolating film 27 and the control gate electrode 5 as a word line intersect with each other as in the comparative example. However, in this embodiment, the n⁻ drain layer 23 is formed wide enough to reach the region under the floating gate electrode 3. This is because of the following reasons.

When phosphorus ions are implanted, the phosphorus ions, having a range larger than that of arsenic and smaller than that of boron, are blocked by the thicker portions of the bird's beaks of the LOCOS isolating film 27, but pass through the less thick portions of the bird's beaks. Thus, as shown in FIG. 17(a), in the cross section orthogonal to the gate length direction of the floating gate electrode 3, the phosphorus ion implanted layer 18 is formed to reach a region immediately under the less thick portion of the bird's beaks of the LOCOS isolating film 27. That is to say, the phosphorus ion implanted layer 18 is formed to reach an intermediate position between the boron ion implanted layer 19 and the arsenic ion implanted layer 17. In addition, the diffusion coefficient of phosphorus is larger than that of arsenic. As a result, after the heat treatment for activating the impurities has been conducted, the n⁻ drain layer 23 is formed to reach the region under the LOCOS isolating film 27, as shown in FIG. 17(b).

Such a structural difference will be described in detail with reference to the cross-sectional structures taken along the gate length direction of the floating gate electrode 3. In the cross section, passing the centerline of the drain region, of the memory cell in the comparative example, the n⁺ drain layer 22 reaches the region under the floating gate electrode 3 as shown in FIGS. 14(a) and 14(b). Similarly, in the cross section, passing the centerline of the drain region, of the memory cell in the first embodiment, the n⁺ drain layer 22 also reaches the region under the floating gate electrode 3 as shown in FIGS. 5(a) and 5(b), and overlaps with the floating gate electrode 3 to substantially the same degree as the n⁻ drain layer 23. That is to say, in the center portion of the drain region, the area of the n⁻ drain layer 23 is so narrow that an abrupt p-n junction is formed between the p layer 24 and the n⁺ drain layer 22 as in the memory cell of the comparative example. Thus, it can be understood that the memory cell of the first embodiment can generate a sufficiently large number of channel hot electrons required for the write operation of the nonvolatile semiconductor memory device and that the write operation is very unlikely to be disturbed.

On the other hand, in the cross section passing one end of the drain region (i.e., in the vicinity of the intersection Pt) of the memory cell in the comparative example, the n⁺ drain layer 22 does not reach the region under the floating gate electrode 3 and does not overlap with the floating gate electrode 3 when viewed from above as shown in FIGS. 15(a) and 15(b). As a result, the p-n junction, i.e., the region where hot holes are generated owing to GIDL, is located at the same position as the edge of the gate at which the electric field is concentrated. Accordingly, the electric field applied between the floating gate electrode and the drain of a non-selected memory cell connected to a selected 10 bit line has as high intensity as about 7 MV/cm during a write operation as shown in FIG. 15(c). Thus, it is highly probable that generated hot holes travel long way to reach so far as the inside of the tunnel insulating film 2 and thereby produce hot holes traps. And it is also highly probable that the holes reach the floating gate electrode 3. On the other hand, on the cross section passing the end of the drain of the memory cell of the first embodiment, the n⁺ drain layer 22 does not either reach the region under the floating gate electrode 3, but the n⁻ drain layer 23 does reach the region under the floating gate electrode 3 as shown in FIGS. 6(a) and 6(b). As a result, as shown in FIG. 6(c), the p-n junction, i.e., the region where hot holes are generated owing to GIDL, is located at a different position than the edge of the gate at which the electric field is concentrated. Accordingly, in the region where hot holes are generated owing to GIDL, the intensity of the electric field applied to the gate oxide film of a non-selected memory cell connected to a selected bit line is weakened to about 3 MV/cm during a write operation. Thus, it is less probable that hot holes, generated during writing, reach the inside of the tunnel insulating film 2. That is to say, even if hot-hole traps have been produced inside the tunnel insulating film 2, such traps are produced nowhere but the vicinity of the surface of the tunnel insulating film 2. The above-described effects can be attained by using impurity ions having a larger range than that of arsenic ions. However, these effects can be attained with more certainty by using impurity ions, such as phosphorus ions, having not only a larger range but also a larger diffusion coefficient during a heat treatment.

It is imaginable that arsenic ions might pass through a part of the bird's beaks by setting the implant energy for implanting the arsenic ions at a larger value. However, if the implant energy is too large, then the peak of concentration of the n⁺ drain layer 22 is located at a position deep inside the substrate. In such a case, writing into the floating gate electrode 3 might be unsatisfactory and the basic performance of the nonvolatile semiconductor memory device might be deteriorated. Also, the arsenic ions, which have been accelerated with such high energy, might pass through the protective oxide film 6 and do damage to the tunnel insulating film 2. Furthermore, since the n⁺ drain layer 22 is located at a position deep inside the substrate, the properties of the LOCOS isolating film 27 might be deteriorated.

FIG. 7 is a graph illustrating the drain-disturb characteristics during writing. In FIG. 7, the axis of abscissas represents a drain stress time during which voltages of 0 V and 5 V are continuously applied to a word line and the drain, respectively, while the axis of ordinates represents a threshold voltage, that is, a gate voltage at which drain current at a constant level starts to flow when the drain voltage is set at 1.0 V and the gate voltage is increased. VTW and VTE on the axis of ordinates respectively represent a post-writing threshold voltage and a post-erasure threshold voltage of the nonvolatile semiconductor memory device. As can be understood from FIG. 7, in the nonvolatile semiconductor memory device of the comparative example, when the drain stress time reaches about 10 seconds, the post-writing threshold voltage VTW becomes closer to the post-erasure threshold voltage VTE. As a result, misjudgment such as taking a memory cell in erasure state for a memory cell in a write state and vice versa, possibly happens. By contrast, in the nonvolatile semiconductor memory device of the first embodiment, there is no fear of such misjudgment until the drain stress time reaches about 100 seconds. In other words, the first embodiment guarantees a tenfold longer drain stress time limit, until which the variation in threshold voltages does not happen. As can be understood, the drain-disturb characteristics of the nonvolatile semiconductor memory device of the first embodiment are much superior to those of the conventional nonvolatile semiconductor memory device.

The memory cell structure of the nonvolatile semiconductor memory device described in the article of IEDEM 90 is equivalent to the structure of the comparative example if the n⁻ source layer 21 of the source region is replaced by the p-type pocket layer 124b. However, the structure of the drain region of the article is fundamentally the same as that of the memory cell structure in the comparative example.

Accordingly, the drain-disturb characteristics of the nonvolatile semiconductor memory device described in the article of IEDEM 90 may be regarded as substantially the same as those of the memory cell in the comparative example.

As described above, in the nonvolatile semiconductor memory device of the first embodiment, the $n^+$ drain layer 22 sufficiently overlaps with the floating gate electrode 3 and yet forms an abrupt p-n junction with the p layer 24 on the cross section passing the centerline of the drain region of the memory cell. Thus, when the nonvolatile semiconductor memory device performs a write operation, a sufficiently large number of channel hot electrons are generated and a write speed as high as that of a conventional nonvolatile semiconductor memory device can be maintained. On the other hand, on the cross section passing the end of the drain region, the $n^-$ drain layer 23 sufficiently overlaps with the floating gate electrode 3 as viewed from above. Thus, the intensity of the electric field applied between the floating gate electrode and the drain in the vicinity of the p-n junction in the drain-disturb state during writing is weakened and the drain-disturb characteristics can be improved during writing as shown in FIG. 7. That is to say, a highly reliable non-volatile semiconductor memory device is realized.

It is noted that the $n^-$ drain layer 23 should at least be formed to sufficiently overlap with the floating gate electrode 3 in the vicinity of the LOCOS isolating film 27. Even then, there is no fear that the short channel effects are promoted.

Since the drain-disturb characteristics are improved according to the present invention, the following effects can be attained.

Figure 8A:
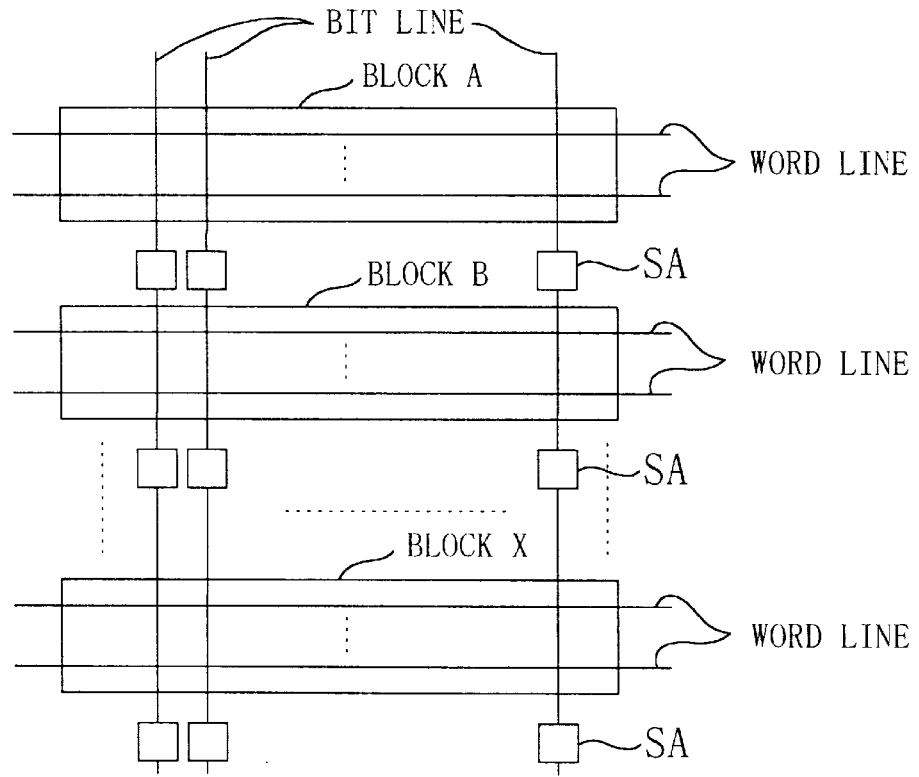
FIG. 8(a) is a circuit block diagram showing an arrangement for an array of memory cells in a conventional nonvolatile semiconductor memory device.
Figure 8B:
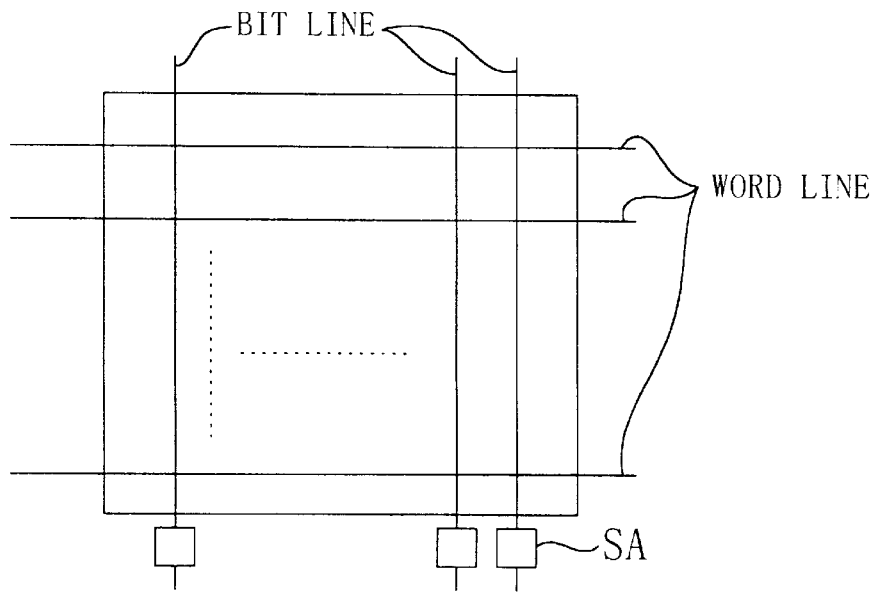
FIG. 8(b) is a circuit block diagram showing an arrangement for an array of memory cells in the nonvolatile semiconductor memory device of the first embodiment.

FIGS. 8(a) and 8(b) are circuit block diagrams illustrating memory cell array structures for a conventional nonvolatile semiconductor memory device and the nonvolatile semiconductor memory device of the first embodiment, respectively. Considering the inferior drain-disturb characteristics thereof, in a conventional memory cell array structure, an array of memory cells should be divided into several blocks, a sense amplifier SA should be provided for each bit line in each block and a write operation should be performed on the block basis as shown in FIG. 8(a). This is because, if the number of memory cells connected to a common bit line is too large, then the drain stress time is adversely prolonged and the variation in threshold voltages possibly happens.

By contrast, in the memory cell array of the nonvolatile semiconductor memory device of the present invention, all the memory cells may be arranged within a single block and only a single sense amplifier SA should be disposed per bit line as shown in FIG. 8(b). This is because, even if the drain stress time is prolonged as the number of memory cells connected to a common bit line is increased, the variation in threshold voltages rarely happens. Of course, if the number (i.e., the degree of integration) has increased by leaps and bounds, it might be necessary to divide the memory cell array into several blocks. Even so, the number of blocks can still be only one-tenth compared to the memory cell array of a conventional nonvolatile semiconductor memory device. Thus, according to the present invention, not only the costs but also the number of sense amplifies, occupying a large area in total, can be reduced. As a result, the degree of integration can be considerably increased for a nonvolatile semiconductor memory device.

It is noted that in order to attain the above-described effects of the first embodiment, the concentration of phosphorus in the $n^-$ drain layer 23 shown in FIG. 1 is preferably in the range from $3 \times 10^{18}$ cm$^{-2}$ to $1 \times 10^{19}$ cm$^{-2}$. In order to obtain such an appropriate concentration range, the dose of $P^+$ ions is preferably in the range from $3 \times 10^{13}$ cm$^{-2}$ to $1 \times 10^{14}$ cm$^{-2}$ in the ion implantation process step shown in FIG. 3(a). On the other hand, the concentration of boron in the boron ion implanted layer 24 may be anywhere above $1 \times 10^{19}$ cm$^{-2}$. The upper limit of the concentration is variable depending upon the structure and type of a memory cell transistor of a nonvolatile semiconductor memory device, and therefore may be set at any arbitrary value so long as the memory cell transistor can operate smooth.

Embodiment 2

In this embodiment, a method for inspecting a nonvolatile semiconductor memory device will be described. Even in the method for fabricating a nonvolatile semiconductor memory device in the first embodiment, the $n^-$ drain layer 23 in the drain region may sometimes not sufficiently overlap with the floating gate electrode 3 because of deposition of dust, generation of defects and the like during a process. In such a case, hot hole traps are produced in the tunnel insulating film 2, thereby deteriorating the drain-disturb characteristics and adversely varying the number of electrons in the floating gate electrode 3. Then, in accordance with the method illustrated in FIGS. 9(a) through 9(e), defective nonvolatile semiconductor memory devices (memory cells) can be detected. Such an inspection method is, however, exclusively applicable to the nonvolatile semiconductor memory device of the present invention, but may be broadly applicable to any nonvolatile semiconductor memory device provided with a memory cell including a floating gate electrode.

FIG. 9(a) is a diagram schematically illustrating an arrangement for an array of memory cells, in which a plurality of memory cells, each having the structure described in the first embodiment, for example, are arranged in columns and rows. In inspecting, all the memory cells, arranged in NOR fashion, are turned into erasure state beforehand, and then the read current of all the memory cells are sensed. To each word line 29, the control gates 5 of a plurality of nonvolatile semiconductor memory devices (memory cells) are connected in common. And to each bit line 30, the $n^{++}$ drain layers 26a of a plurality of nonvolatile semiconductor memory devices (memory cells) are connected in common. In this array of memory cells arranged in NOR fashion, a plurality of word lines 29 and a plurality of bit lines 30 are arranged in matrix and a single memory cell is disposed for each intersection thereof.

Next, as shown in FIG. 9(b), a voltage at such a level as generating hot holes in the drain (e.g., 5 V) is applied to all of the bit lines 30 for a predetermined time. In this state, no electrons are accumulated in each floating gate electrode 3 and thus the electric field applied between the floating gate electrode 3 and an associated drain has a relatively low intensity. Accordingly, hot hole traps such as that shown in FIG. 9(c) is caused only in defective memory cells.

Thereafter, as shown in FIG. 9(d), a constant high voltage (e.g., 8 V) is applied to all of the word lines 29 for a predetermined time, and then the read current of all the memory cells arranged in NOR fashion is sensed. In this case, if the read current of a memory cell is different from already measured one when in the erasure state, then it can be determined that hot hole traps has been produced in the tunnel insulating film thereof. In such a case, the defective cell sensed is replaced with a redundant cell, or the entire nonvolatile semiconductor memory device including such a cell is determined defective. As shown in FIG. 9(e), positive charge traps exist in the middle of or around the surface of the tunnel insulating film in the vicinity of the drain of a defective memory cell. Thus, the potential in the tunnel insulating film decreases, electrons are unintentionally injected via the traps into the floating gate electrode 3 and the state of such a memory cell gets variable.

In accordance with the method of this embodiment, a memory cell in such a state that drain-disturb phenomenon is very likely to happen because of deposition of dust, generation of defects and the like during a fabrication process can be rapidly spotted electrically. This method is particularly effectively applicable to a nonvolatile semiconductor memory device having the structure of the present invention, because a memory cell, in which a drain layer does not sufficiently overlap with the floating gate electrode owing to such trouble, can be sensed electrically.

Embodiment 3

Next, the third embodiment of the present invention will be described. FIGS. 10(a) through 10(c) and FIGS. 11(a) through 11(c) are cross-sectional views illustrating the process steps for fabricating the nonvolatile semiconductor memory device of the third embodiment. The nonvolatile semiconductor memory device of this embodiment has the same structure as that of the device in the first embodiment shown in FIG. 1, but is fabricated by a different method.

Figure 10A:
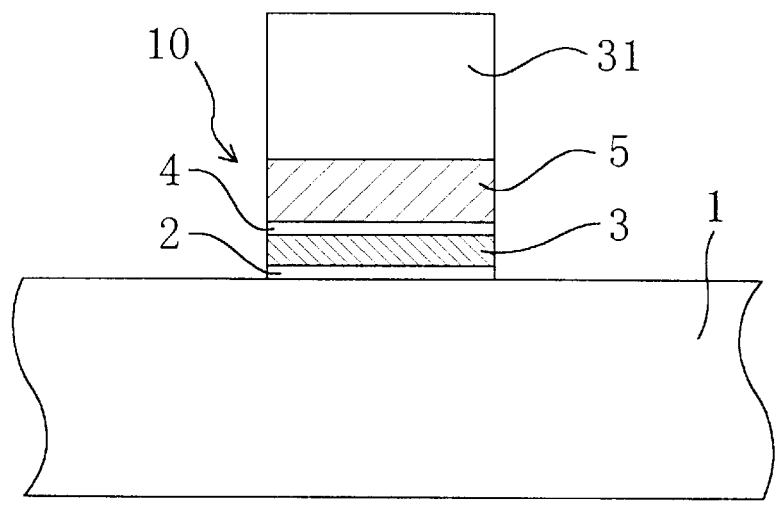
FIGS. 10(a) through 10(c) are cross-sectional views illustrating the first half of the process steps for fabricating a nonvolatile semiconductor memory device in the third embodiment.

First, in the process step shown in FIG. 10(a), a p well and a LOCOS isolating film (neither is shown) are formed in a p-type Si substrate 1. Next, a silicon dioxide film having a thickness of about 10 nm, a first polysilicon film, an ONO film having a thickness of about 18 nm, and a second polysilicon film are sequentially deposited over the p-type Si substrate 1. And a resist film 31 having a gate pattern to be formed is deposited thereon and then anisotropic etching is performed with the resist film 31 used as a mask, thereby sequentially patterning the second polysilicon film, the ONO film, the first polysilicon film and the silicon dioxide film. In this manner, a stacked gate portion 10 including a control gate electrode 5, a capacitive insulating film 4, a floating gate electrode 3 and a tunnel insulating film 2 is formed.

Figure 10B:
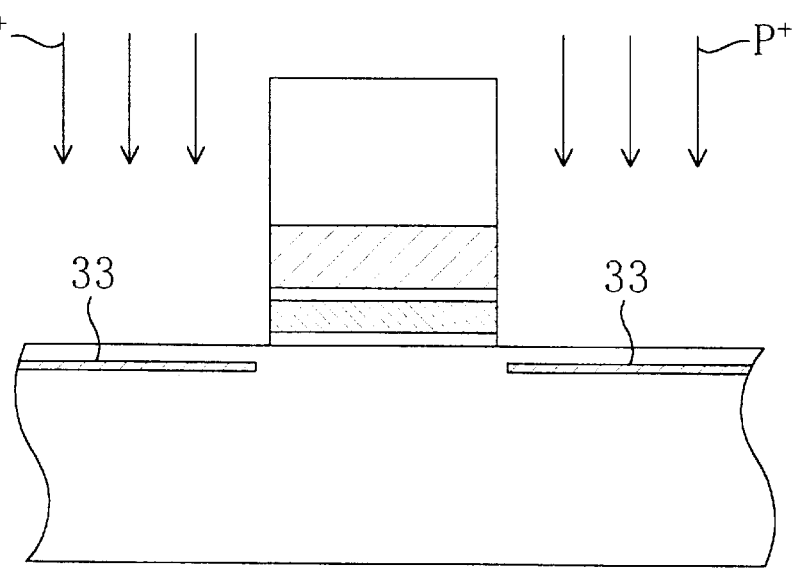

Thereafter, in the process step shown in FIG. 10(b), $P^+$ ions are implanted on the conditions that the acceleration voltage is set in the range from 30 keV to 80 kev (preferably from 35 keV to 60 keV) and the dose is set at about $1\times10^{14}$ cm$^{-2}$, thereby forming a phosphorus ion implanted layer 33 in the source/drain regions of the p-type Si substrate 1.

Figure 10C:
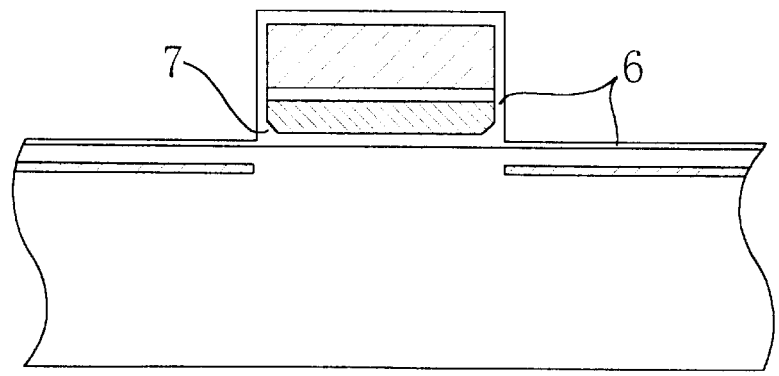

Subsequently, in the process step shown in FIG. 10(c), a thermal oxidation process is conducted, thereby forming a protective oxide film 6 over the entire surface of the substrate. During this oxidation process, the ridge portions at the lower ends of the floating gate electrode 3 are oxidized to form gate bird's beaks 7. The protective oxide film 6 is formed to prevent unnecessary contamination during the implantation of various types of ions. Also, since the gate bird's beaks 7 are simultaneously formed, the ridge portions of the floating gate electrode 3 are as it were chamfered.

Figure 11A:
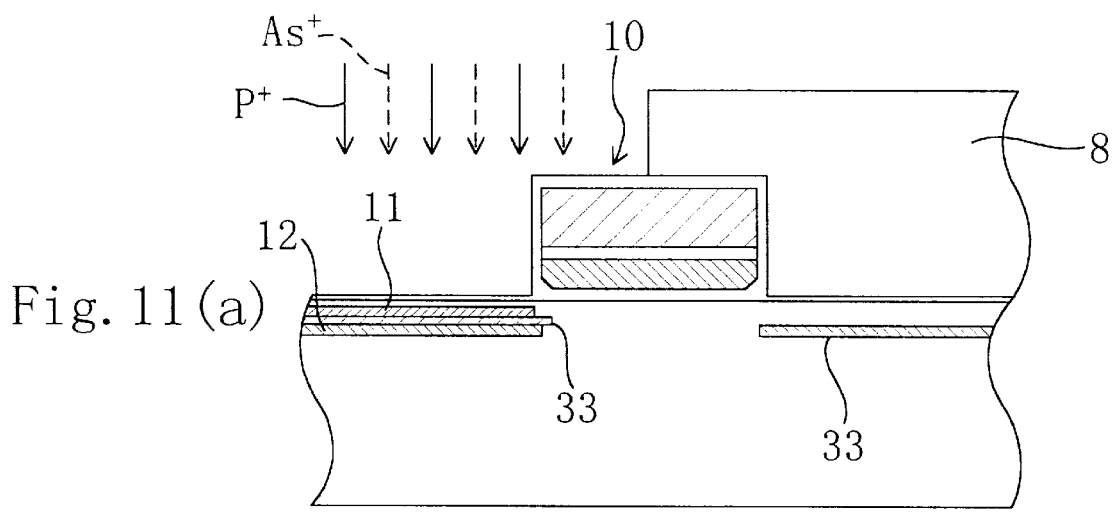
FIGS. 11(a) through 11(c) are cross-sectional views illustrating the second half of the process steps for fabricating the nonvolatile semiconductor memory device in the third embodiment.

Next, in the process step shown in FIG. 11(a), a resist film 8 is formed to cover approximately one half of the stacked gate portion 10 and the drain region of the p-type Si substrate 1 and have an opening over the source region of the p-type Si substrate 1. And by using this resist film 8 as a mask, impurity ions are implanted into the source region of the p-type Si substrate 1. First, $As^+$ ions are implanted on the conditions that the acceleration voltage is set in the range from 30 keV to 80 keV (preferably from 35 keV to 60 keV) and the dose is set at about $6\times10^{15}$ cm$^{-2}$, thereby forming an arsenic ion implanted layer 11. Then, $P^+$ ions are implanted on the conditions that the acceleration voltage is set in the range from 30 keV to 80 keV (preferably from 35 keV to 60 kev) and the dose is set at about $1.5\times10^{15}$ cm$^{-2}$, thereby forming a phosphorus ion implanted layer 12. In FIG. 11(a), only the peak portions of the arsenic and phosphorus ion implanted layers 11, 12 are illustrated. However, in actuality, the arsenic and phosphorus ion implanted layers 11, 12 both expand over wide areas in the depth direction.

Figure 11B:
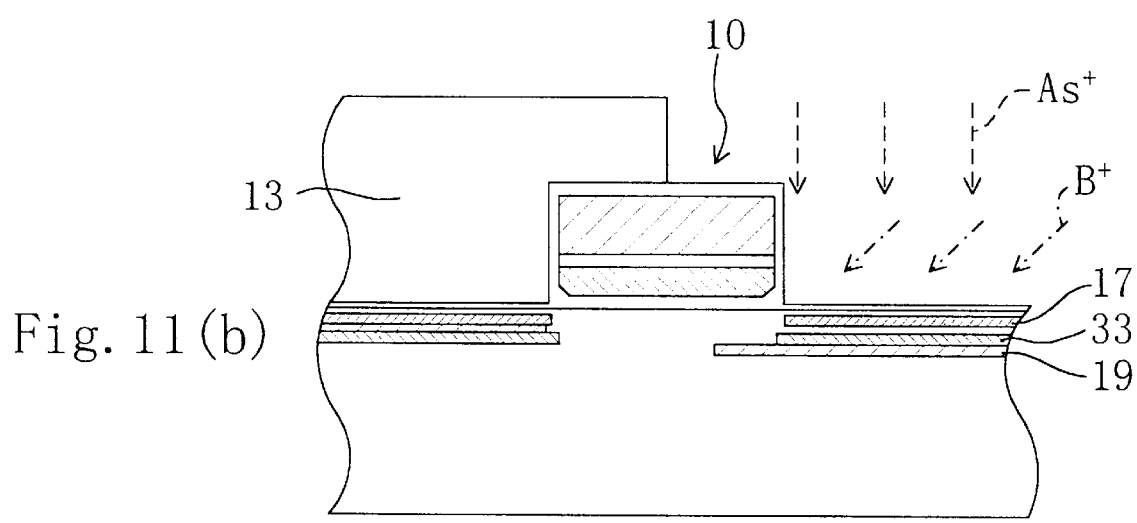

Subsequently, in the process step shown in FIG. 11(b), a resist film 13 is formed to cover the other half of the stacked gate portion 10 and the source region of the p-type Si substrate 1 and have an opening over the drain region of the p-type Si substrate 1. And by using this resist film 13 as a mask, impurity ions are implanted into the drain region of the p-type Si substrate 1. First, $As^+$ ions are implanted on the conditions that the acceleration voltage is set in the range from 30 keV to 80 keV (preferably from 35 keV to 60 keV) and the dose is set at about $5\times10^{14}$ cm$^{-2}$, thereby forming an arsenic ion implanted layer 17. Next, $B^+$ ions are implanted on the conditions that the acceleration voltage is set in the range from 40 keV to 70 keV (preferably from 45 keV to 60 keV) and the dose is set at about $2.5\times10^{13}$ cm$^{-2}$, thereby forming a boron ion implanted layer 19. In FIG. 11(b), only the peak portions of the arsenic, phosphorus and boron ion implanted layers 17, 33, 19 are illustrated. However, in actuality, the arsenic, phosphorus and boron ion implanted layers 17, 33, 19 all expand over wide areas in the depth direction. In this process step, $B^+$ ions are implanted in accordance with large-angle-tilt ion implantation technique in which the implant angle is set to be tilted 45 degrees with respect to the normal of the principal surface of the p-type Si substrate 1. In this manner, the boron ion implanted layer 19 can be formed to reach a region overlapping with the stacked gate portion 10.

Figure 11C:
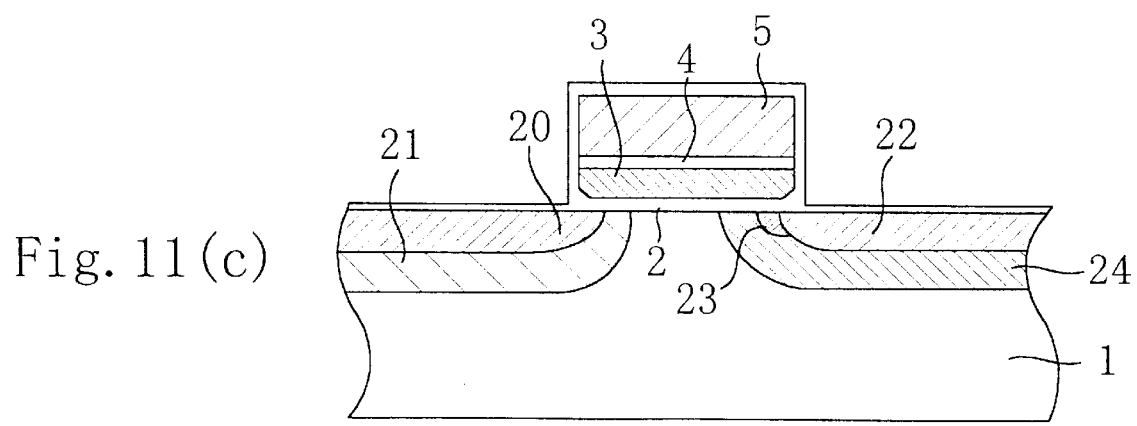

Thereafter, in the process step shown in FIG. 11(c), a heat treatment is conducted at about 900° C., thereby activating and diffusing the impurities in the respective arsenic, phosphorus and boron ion implanted layers 11, 17, 12, 33, 19. In this manner, $n^+$ and $n^-$ source layers 20, 21 are formed in the source region of the p-type Si substrate 1, while $n^+$ and $n^-$ drain layers 22, 23 and a p layer 24 are formed in the drain region. In the source region in the p-type Si substrate 1, the concentration of phosphorus introduced into the phosphorus ion implanted layer 33 is lower than that of phosphorus introduced into the phosphorus ion implanted layer 12. Thus, as a result of the heat treatment, the $n^-$ source layer 21 is formed almost totally owing to the diffusion of phosphorus in the phosphorus ion implanted layer 12. And, the $n^-$ source layer 21 containing phosphorus having relatively large range and diffusion coefficient is formed to surround the bottom of the $n^+$ source layer 20 containing arsenic having smaller range and diffusion coefficient than those of phosphorus. Also, the $n^-$ source layer 21 is formed over a wide area in the vicinity of the surface of the p-type Si substrate 1 so as to overlap with the stacked gate portion 10.

On the other hand, in the drain region of p-type Si substrate 1, the $n^-$ drain layer 23 containing phosphorus having relatively large range and diffusion coefficient is formed in a wider area than that of the $n^+$ drain layer 22 containing arsenic having smaller range and diffusion coefficient than those of phosphorus. Also, the $n^-$ drain layer 23 is formed in the vicinity of the surface of the p-type Si substrate 1 so as to overlap with the stacked gate portion 10. However, since phosphorus contained in the phosphorus ion implanted layer 33 is at a relatively low concentration, phosphorus is neutralized with boron in the boron ion implanted layer 24 in the deeper regions of the p-type Si substrate 1. Thus, the $n^-$ drain layer 23 is formed only in the vicinity of the surface of the p-type Si substrate 1 to overlap with the stacked gate portion 10. The p layer 24 containing boron, which has been implanted with relatively high energy and has a larger diffusion coefficient, is formed to surround the bottoms of the n⁺ and n⁻ drain layers 22, 23 and to reach an inner point under the stacked gate portion 10 than the n⁻ drain layer 23 in the region in the vicinity of the surface of the p-type Si substrate 1.

Thereafter, the same process step as that shown in FIG. 3(c) of the first embodiment is performed, thereby forming insulator sidewalls and n⁺⁺ drain/source layers 26a, 26b.

In the third embodiment, the effects of the first embodiment can also be attained. In addition, P⁺ ions are implanted before the protective oxide film 6 and the gate bird's beaks 7 are formed, i.e., immediately after the stacked gate portion 10 has been formed by patterning the tunnel insulating film 2, the first polysilicon film 3, the capacitive insulating film 4 and the second polysilicon film 5. Thus, the phosphorus ion implanted layer 33 can be diffused deeper into the region under the floating gate electrode 3 as compared with the first embodiment.

In the third embodiment, P⁺ ions are implanted to form the n⁻ drain layer 23 in the drain region before the protective oxide film 6 and the gate bird's beaks 7 are formed. And after the protective oxide film 6 and the gate bird's beaks 7 have been formed, As+ions are implanted to form the n⁺ drain layer 22 in the drain region. Alternatively, As⁺ ions may be implanted before the protective oxide film 6 and the gate bird's beaks 7 are formed. And after the protective oxide film 6 and the gate bird's beaks 7 have been formed, P⁺ ions may be implanted. Also, P⁺ and As⁺ ions both may be implanted before the protective oxide film 6 and the gate bird's beaks 7 are formed.

In the first and third embodiments, two types of ions (P⁺, As⁺) having respectively different ranges and diffusion coefficients are implanted to form the drain region. Alternatively, three or more types of ions may be implanted. Then, just like the n⁻ drain layer 23 in the drain region overlapping with the floating gate electrode 3, at least one diffusion layer should be formed by implanting at least one of the three or more types of ions, which has a relatively large range during ion implantation, so as to overlap with the entire edge of the stacked gate portion 10 in the gate width direction in the active region.

In the first and third embodiments, all the n-type and p-type regions may reverse the conductivity types thereof.

What is claimed is:

1. A method for fabricating a nonvolatile semiconductor memory device, comprising the steps of:

a) forming a stacked gate portion by stacking a tunnel insulating film, a floating gate, a capacitive insulating film and a control gate in this order over a top face of a semiconductor substrate of a first conductivity type;

b) forming first and second diffusion layers each of a second conductivity type by implanting first impurity ions of the second conductivity type and second impurity ions of the second conductivity type, respectively, using the stacked gate portion as a mask in an active region of the semiconductor substrate, the first and second diffusion layers forming a portion of a drain region; and c) forming a third diffusion layer of a first conductivity type surrounding the bottom of the portion of the drain region of the second conductivity type, which portion is formed of the first and second diffusion layers, the third diffusion layer comprising third impurity ions of the first conductivity type;

d) forming a sidewall on a side face of the stacked gate portion; and e) forming a fourth diffusion layer of the second conductivity type to complete the drain region by implanting fourth impurity ions of the second conductivity type using the stacked gate portion and the sidewall as a mask, the drain region being formed of the first, second, and fourth diffusion layers, wherein the first diffusion layer is formed so as to exhibit an overlap with a portion of the stacked gate portion when viewed from above, and the fourth diffusion layer, the second diffusion layer and the first diffusion layer are formed so as to be arranged in this order along a direction from an edge of the sidewall to an edge of the gate stacked portion in a region beneath the top face of the semiconductor substrate.

2. The method of claim 1, wherein in the step b), wherein each of the first impurity ions has a larger range than that of the second impurity ions, and heat treatment is conducted after the first and second impurity ions are implanted, thereby to form the first and second diffusion layers.

3. The method of claim 1, further comprising a step of forming fifth and sixth diffusion layers to form a source region by implanting fifth impurity ions of the second conductivity type in the active region of the semiconductor substrate using the stacked gate portion as a mask, simultaneously with the formation of the first and second diffusion layers in the step (b).

4. The method of claim 2, wherein in the step b), a dose of the first impurity ions is set smaller than a dose of the second impurity ions.

5. The method of claim 2, wherein in the step b), at least one out of the first impurity ions and the second impurity ions are implanted immediately after the stacked gate portion has been formed.

6. The method of claim 2, wherein in the step c), the third diffusion layer of the first conductivity type is formed by implanting the third impurity ions of the first conductivity type at a tilt angle of 20 degrees or more with respect to the normal of the semiconductor substrate in accordance with large-angle-tilt ion implantation technique such that the third impurity ions are also implanted into a region under the stacked gate portion.

7. The method of claim 2, wherein the first impurity ions have a larger diffusion coefficient than that of the second impurity ions during heat treatment for activating the impurities.

* * * * *